(12) United States Patent
Kawabuchi et al.

(10) Patent No.: US 10,867,814 B2
(45) Date of Patent: Dec. 15, 2020

(54) LIQUID PROCESSING METHOD, SUBSTRATE PROCESSING APPARATUS, AND STORAGE MEDIUM

(71) Applicant: Tokyo Electron Limited, Tokyo (JP)

(72) Inventors: Yosuke Kawabuchi, Kumamoto (JP); Kouzou Tachibana, Kumamoto (JP); Mitsunori Nakamori, Kumamoto (JP); Kotaro Ooishi, Kumamoto (JP); Keisuke Egashira, Kumamoto (JP); Koji Tanaka, Kumamoto (JP); Hiroaki Inadomi, Kumamoto (JP); Masami Yamashita, Kumamoto (JP); Yoshiteru Fukuda, Kumamoto (JP); Koji Yamashita, Kumamoto (JP); Yu Tsurifune, Kumamoto (JP); Takuro Masuzumi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 552 days.

(21) Appl. No.: 15/432,044

(22) Filed: Feb. 14, 2017

(65) Prior Publication Data

US 2017/0236729 A1 Aug. 17, 2017

Related U.S. Application Data

(63) Continuation-in-part of application No. 15/426,115, filed on Feb. 7, 2017, now abandoned.

(30) Foreign Application Priority Data

Feb. 15, 2016 (JP) .................. 2016-026108
Aug. 8, 2016 (JP) .................. 2016-155687

(51) Int. Cl.
*B08B 3/04* (2006.01)
*B08B 3/10* (2006.01)
(Continued)

(52) U.S. Cl.
CPC .. *H01L 21/67051* (2013.01); *H01L 21/02057* (2013.01); *H01L 21/67028* (2013.01)

(58) Field of Classification Search
CPC ......... H01L 21/67051; H01L 21/67028; H01L 21/02057
See application file for complete search history.

(56) References Cited

U.S. PATENT DOCUMENTS

2010/0330283 A1* 12/2010 Nakamori ........... H01L 21/6715
427/299
2012/0045581 A1* 2/2012 Kimura ............. H01L 21/02057
427/248.1

(Continued)

FOREIGN PATENT DOCUMENTS

JP 2007-165661 A 6/2007
JP 2012-044144 A 3/2012

(Continued)

*Primary Examiner* — Alexander Markoff
(74) *Attorney, Agent, or Firm* — Abelman, Frayne & Schwab

(57) ABSTRACT

Disclosed is a liquid processing method of drying a substrate held horizontally after supplying deionized water to the substrate. The liquid processing method includes: supplying the deionized water to a front surface of the substrate; supplying a first solvent to the front surface of the substrate after supplying the deionized water; supplying a water-repellent agent to the front surface of the substrate to impart water-repellency to the front surface of the substrate; supplying a second solvent to the front surface of the substrate to which water-repellency is imparted; and removing the second solvent from the front surface of the substrate. A specific gravity of the first solvent is smaller than a specific gravity of the water-repellent agent, and a specific gravity of the second solvent is larger than the specific gravity of the water-repellent agent.

17 Claims, 19 Drawing Sheets

(51) Int. Cl.
  *B08B 3/14* (2006.01)
  *H01L 21/02* (2006.01)
  *B08B 3/08* (2006.01)
  *H01L 21/67* (2006.01)

(56) References Cited

U.S. PATENT DOCUMENTS

| | | | |
|---|---|---|---|
| 2012/0164339 A1* | 6/2012 | Nakamori | H01L 21/67051 427/401 |
| 2012/0264308 A1* | 10/2012 | Watanabe | H01L 21/3105 438/757 |
| 2014/0283882 A1* | 9/2014 | Kimura | H01L 21/02057 134/26 |
| 2014/0377463 A1* | 12/2014 | Hachiya | B05D 3/107 427/341 |
| 2015/0179431 A1* | 6/2015 | Kimura | H01L 21/02057 134/30 |
| 2016/0111303 A1* | 4/2016 | Nakamori | H01L 21/67028 134/18 |
| 2016/0300710 A1* | 10/2016 | Oishi | H01L 21/02057 |
| 2017/0103881 A1* | 4/2017 | Egashira | B08B 3/08 |

FOREIGN PATENT DOCUMENTS

| | | |
|---|---|---|
| JP | 2012-222329 A | 11/2012 |
| JP | 2014-197571 A | 10/2014 |
| JP | 2015-233108 A | 12/2015 |
| JP | 2016-103597 A | 6/2016 |

\* cited by examiner (a)

(b)

(c)

(d)

LIQUID PROCESSING METHOD, SUBSTRATE PROCESSING APPARATUS, AND STORAGE MEDIUM

CROSS-REFERENCE TO RELATED APPLICATIONS

This application is a continuation in part of U.S. patent application Ser. No. 15/426,115, filed on Feb. 7, 2017, which claims priority from Japanese Patent Application Nos. 2016-026108 and 2016-155687 filed on Feb. 15, 2016 and Aug. 8, 2016, respectively, with the Japan Patent Office, the disclosures of which are incorporated herein in their entireties by reference.

TECHNICAL FIELD

The present disclosure relates to a technique of drying a substrate after a processing is performed on the substrate by supplying a processing liquid thereto.

BACKGROUND

In a single wafer type spin cleaning apparatus that performs a liquid processing on a semiconductor wafer (hereinafter, referred to as a "wafer") as a substrate, an alkaline or acidic chemical liquid is supplied to the surface of the wafer that is rotating, and the chemical liquid is spread over the surface of the wafer to remove dust or native oxide on the surface of the wafer. The chemical liquid remaining on the surface of the wafer is removed by a rinse liquid such as, for example, deionized water. When the supply of the rinse liquid is stopped while the wafer is rotated, the remaining rinse liquid is shaken off. Thus, a dried wafer may be obtained.

Meanwhile, when the wafer is dried by the method described above, pattern collapse may occur in which the pattern formed on the surface of the wafer collapses.

As a method for removing the rinse liquid remaining on the surface of the surface of the wafer while suppressing the occurrence of pattern collapse, for example, Japanese Patent Laid-Open Publication No. 2012-044144 discloses a technique of hydrophobizing the surface of the wafer by supplying a hydrophobizing agent (corresponding to the water-repellent agent of the present disclosure) to the wafer from which the chemical liquid has been removed (see, e.g., claim 3, paragraphs 0039 to 0041, and FIG. 5).

According to the technique disclosed in Japanese Patent Laid-Open Publication No. 2012-044144, in a first solvent rinsing processing, which is a processing of supplying a solvent before the hydrophobic treatment, and a pre-drying rinse processing, which is a processing of supplying a solvent after the hydrophobic treatment, a common solvent is supplied before and after the processing of supplying the hydrophobizing agent. Examples of the common solvent include isopropyl alcohol (IPA), hydrofluoroether (HFE), and hydrofluorocarbon (HFC).

SUMMARY

The present disclosure provides a liquid processing method of drying a substrate held horizontally after supplying deionized water to the substrate. The liquid processing method includes: supplying deionized water to a front surface of a substrate that is held horizontally; supplying a first solvent to the front surface of the substrate after supplying the deionized water; supplying a water-repellent agent to the front surface of the substrate to impart water-repellency to the front surface of the substrate; supplying a second solvent to the front surface of the substrate to which water-repellency is imparted and removing the second solvent from the front surface of the substrate. A specific gravity of the first solvent is smaller than a specific gravity of the water-repellent agent, and a specific gravity of the second solvent is larger than the specific gravity of the water-repellent agent.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
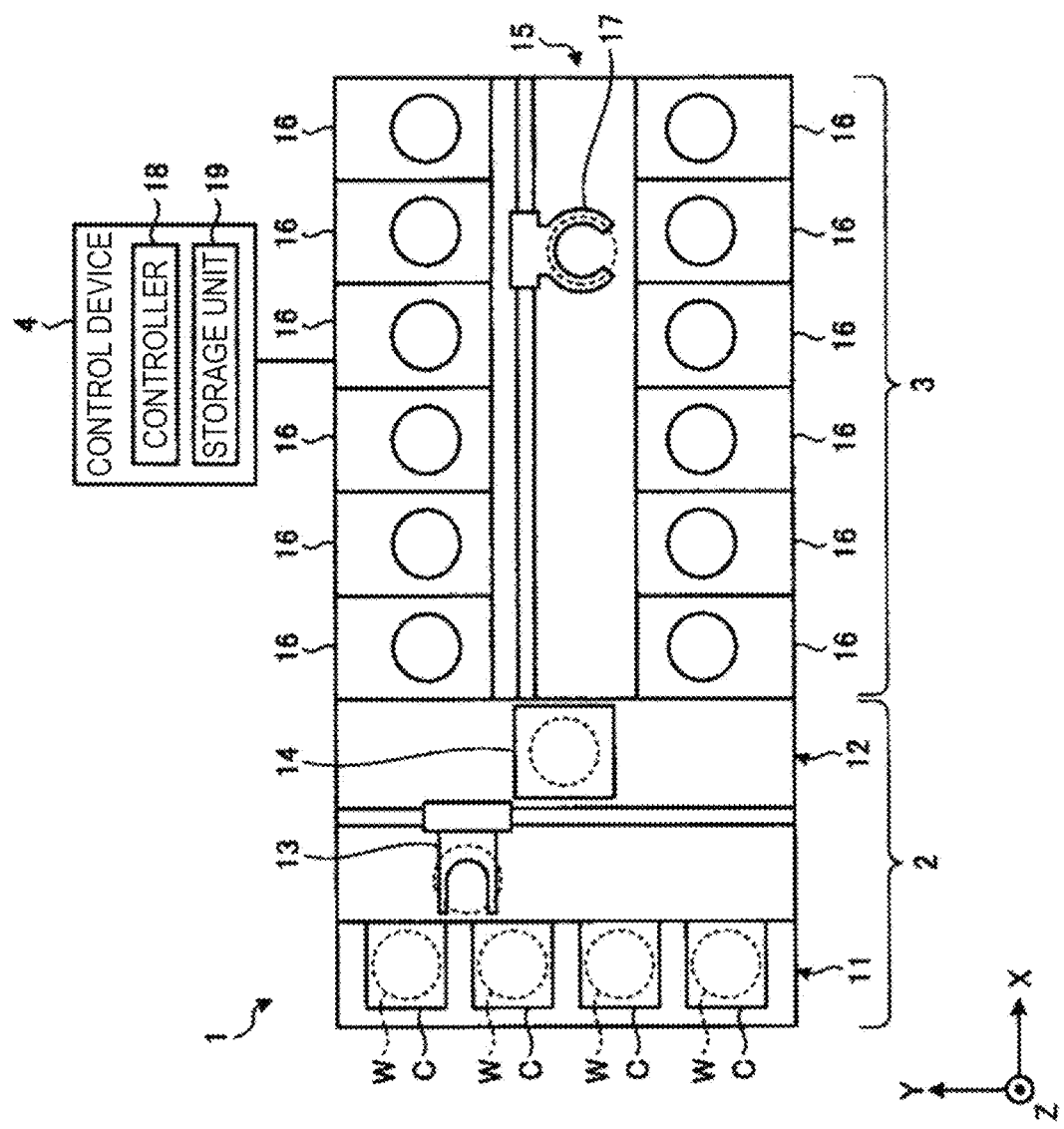
FIG. 1 is a plan view illustrating an outline of a substrate processing system provided with a processing unit according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

It has been found that when IPA is adopted as a solvent for the rinse processing before drying, it may take time to replace the hydrophobizing agent in the pattern. Further, IPA is likely to absorb moisture in the atmosphere. Therefore, when water is mixed with the IPA in the pattern, the IPA component having a boiling point lower than that of the moisture in the atmosphere is dried first. Thus, it has also been found that pattern collapse may occur due to the action of the surface tension of the remaining moisture.

In addition, it has been found that when HFE or HFC is adopted as a solvent for the first solvent rinse processing, water may remain in the pattern. It is considered that HFE and HFC have a too low water solubility to be mixed with each other, so that the replacement property with the rinse liquid (deionized water) used for water rinsing is poor. Further, some of hydrophobizing agents (the water-repellent agent in the present disclosure) react with moisture so that the hydrophobization ability is lowered. Thus, the remaining moisture after the first solvent rinse processing may bring about insufficient hydrophobization of the surface of the wafer, thereby causing pattern collapse.

The present disclosure has been made under the circumstances as described above, and is to provide a liquid processing method, a substrate processing apparatus, and a storage medium, which are capable of quickly obtaining a dried substrate by removing deionized water and a water-repellent agent present in a pattern of a substrate while performing a water-repellency processing on the surface of the substrate.

The present disclosure provides a liquid processing method of drying a substrate held horizontally after supplying deionized water to the substrate. The liquid processing method includes: supplying deionized water to a front surface of a substrate that is held horizontally; supplying a first solvent to the front surface of the substrate after supplying the deionized water; supplying a water-repellent agent to the front surface of the substrate to impart water-repellency to the front surface of the substrate; supplying a second solvent to the front surface of the substrate to which water-repellency is imparted; and removing the second solvent from the front surface of the substrate. A specific gravity of the first solvent is smaller than a specific gravity of the water-repellent agent, and a specific gravity of the second solvent is larger than the specific gravity of the water-repellent agent.

In the above-described liquid processing method, the first solvent has a mutual solubility with the deionized water and the water-repellent agent, and the second solvent has a mutual solubility with the water-repellent agent but is insoluble in the deionized water.

In the above-described liquid processing method, the first solvent is isopropyl alcohol, the water-repellent agent is trimethylsilyl dimethylamine, and the second solvent is hydrofluoroolefin.

In the above-described liquid processing method, the second solvent has a boiling point higher than a boiling point of the first solvent, and is supplied to the front surface of the substrate in a state of being heated to a temperature higher than the boiling point of the first solvent.

In the above-described liquid processing method, after heating the second solvent to a temperature higher than the boiling point of the first solvent, a gas-liquid separation is performed to separate the heated second solvent and bubbles contained in the second solvent.

In the above-described liquid processing method, before heating the second solvent to a temperature higher than the boiling point of the first solvent, a gas contained in the second solvent is removed.

In the above-described liquid processing method, in the supplying the second solvent, the substrate is rotated around a vertical axis passing through a central portion of the substrate, and the second solvent is supplied to the central portion. In the removing the second solvent, a supply position of the second solvent is moved from the central portion side of the rotating substrate toward a peripheral portion side. After the supply position of the second solvent reaches a preset position on a path from the central portion side to the peripheral portion side, a heated fluid is supplied to a rear surface of the rotating substrate.

In the above-described liquid processing method, the preset position is a position corresponding to a moment when a liquid film of the second solvent in the central portion disappears after the supply position of the second solvent is moved from the central portion.

In the above-described liquid processing method, the heated fluid is deionized water heated to a temperature of 50° C. or more and less than a liquid temperature of the second solvent.

The present disclosure provides a substrate processing apparatus of drying a substrate after supplying deionized water to a front surface of the substrate. The substrate processing apparatus includes: a substrate holding unit that holds the substrate horizontally; a deionized water supply nozzle that supplies deionized water to a front surface of the substrate; a first solvent supply nozzle that supplies a first solvent to the front surface of the substrate; a second solvent supply nozzle that supplies a second solvent to the front surface of the substrate; a water-repellent agent supply nozzle that supplies a water-repellent agent to impart a water-repellency to the front surface of the substrate; and a controller that outputs a control signal to perform: supply of the deionized water from the deionized water supply nozzle to the front surface of the substrate; supply of the first solvent from the first solvent supply nozzle to the front surface of the substrate after the supply of the deionized water; then, supply of the water-repellent agent from the water-repellent agent supply nozzle to the front surface of the substrate; supply of the second solvent form the second solvent supply nozzle to the front surface of the substrate to which water-repellency is imparted; and removal of the second solvent from the front surface of the substrate. A specific gravity of the first solvent is smaller than a specific gravity of the water-repellent agent, and a specific gravity of the second solvent is larger than the specific gravity of the water-repellent agent.

In the above-described substrate processing apparatus, the first solvent has a mutual solubility with the deionized water and the water-repellent agent, and the second solvent has a mutual solubility with the water-repellent agent but is insoluble in the deionized water.

In the above-described substrate processing apparatus, the first solvent is isopropyl alcohol, the water-repellent agent is trimethylsilyl dimethylamine, and the second solvent is hydrofluoroolefin.

The above-described substrate processing apparatus further includes a second solvent heating unit that supplies the second solvent to the front surface of the substrate in a state of being heated to a temperature higher than a boiling point of the first solvent. The second solvent has a boiling point higher than the boiling point of the first solvent.

The above-described substrate processing apparatus further includes a gas-liquid separating unit that is provided at a downstream side of the second solvent heating unit and performs a gas-liquid separation of the heated second solvent and bubbles contained in the second solvent.

The above-described substrate processing apparatus further includes a degassing unit that is provided at an upstream side of the second solvent heating unit and removes a gas contained in the second solvent is removed.

The present disclosure provides a non-transitory computer-readable storage medium that stores a computer program for use in a substrate processing apparatus of drying a substrate held horizontally after supplying deionized water to the substrate. The computer program includes a step group organized to, when executed, causes a computer to execute the liquid processing method described above.

According to the present disclosure, a dried substrate may be quickly obtained by removing deionized water and a water-repellent agent present in a pattern of a substrate while performing a water-repellency processing on the surface of the substrate.

FIG. 1 is a view illustrating a schematic configuration of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14 therein. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3, and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
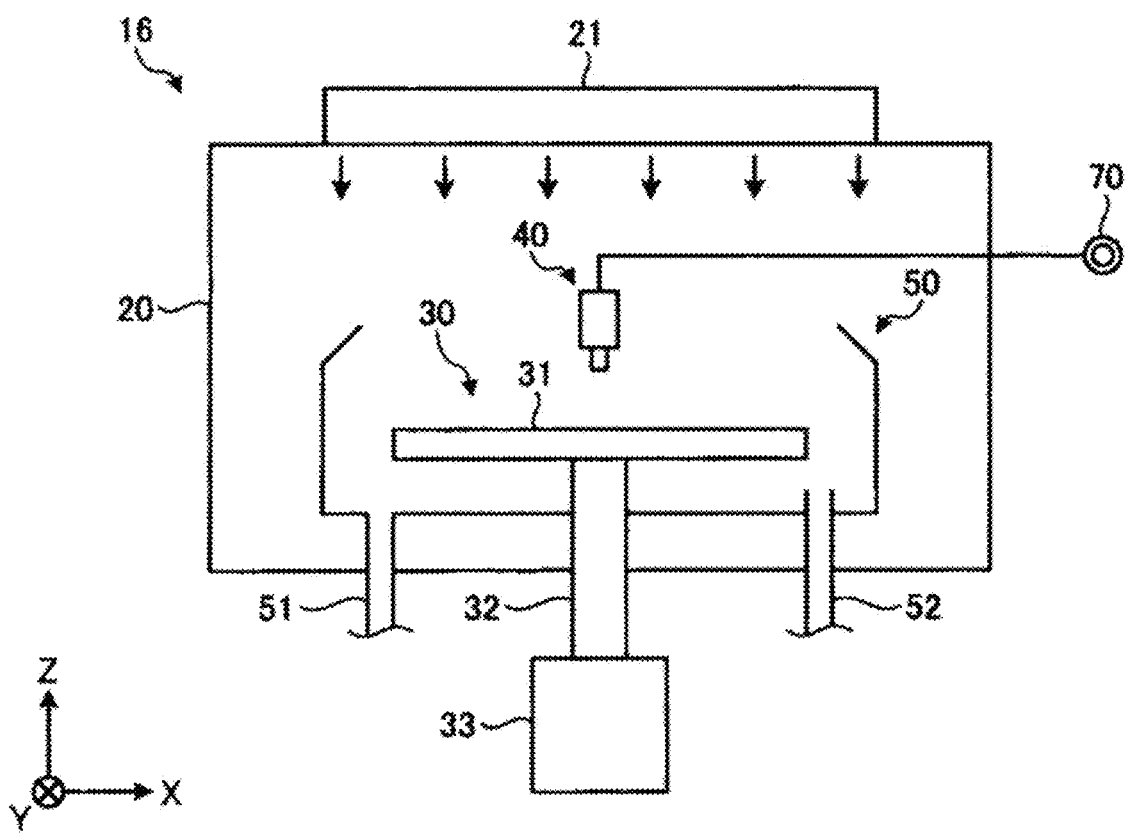
FIG. 2 is a vertical-sectional view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

The processing unit 16 provided in the above-described substrate processing system corresponds to a substrate processing apparatus for performing the liquid processing method according to an exemplary embodiment. Hereinafter, the configuration of the processing unit 16 will be described with reference to FIG. 3.

In the processing unit 16 of the exemplary embodiment, the processing fluid supply unit 40 described above includes a chemical solution nozzle 412, an IPA nozzle 411, a water-repellent agent nozzle 414, and a hydrofluoroolefin (HFO) nozzle 413. The chemical solution nozzle 412 supplies a chemical liquid and deionized water (DIW) to the wafer W held by the substrate holding mechanism (substrate holding unit) 30, the IPA nozzle 411 supplies IPA to the wafer W, and the water-repellent agent nozzle supplies a water-repellent agent to the wafer W, and the hydrofluoroolefin (HFO) nozzle 413 supplies HFO to the wafer W.

Figure 3:
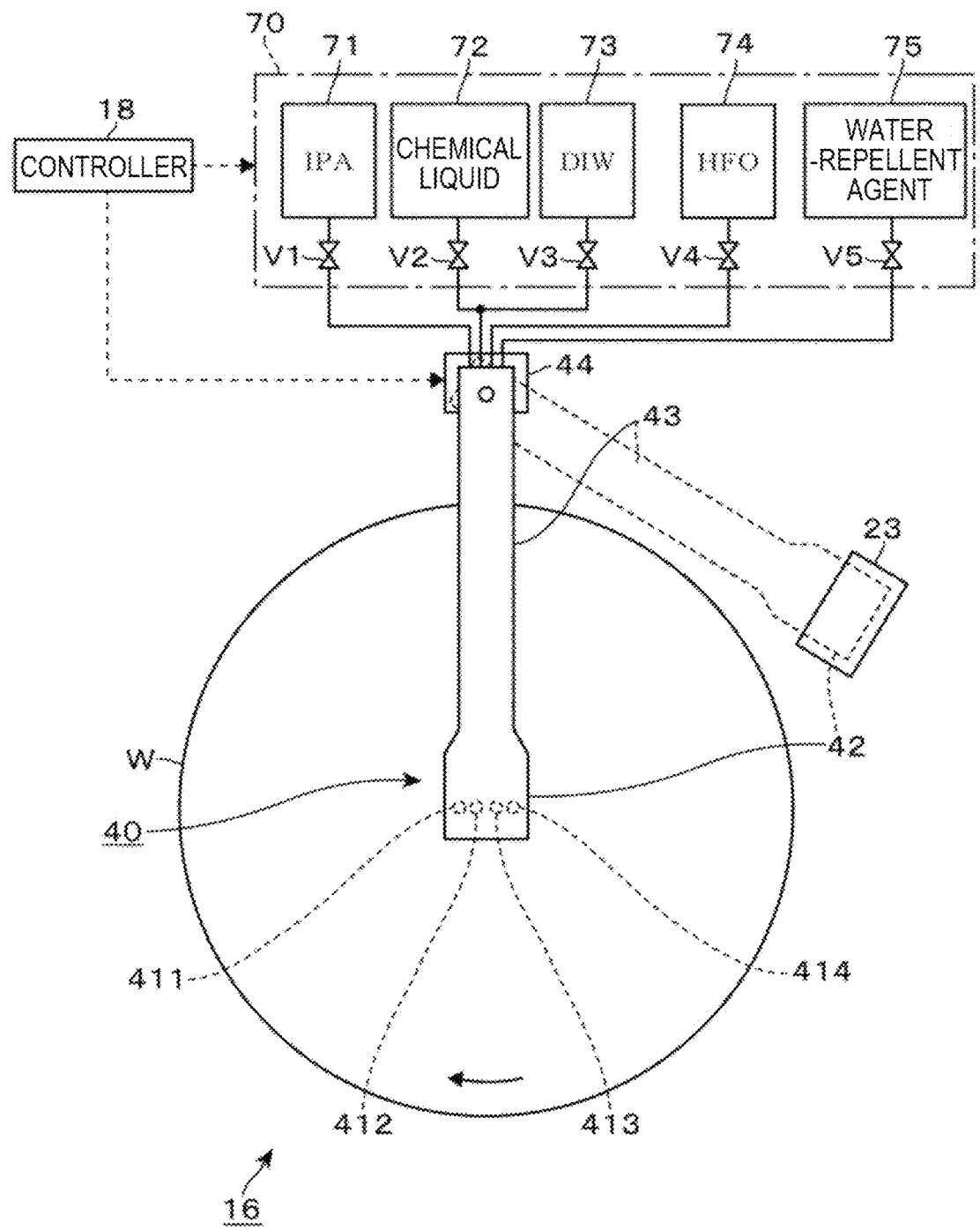
FIG. 3 is a plan view of the processing unit.

The nozzles 411 to 414 are provided in a common nozzle head 42. The nozzle head 42 is connected to a rotation driving unit 44 on the base end side of a nozzle arm 43 via the nozzle arm 43. As the nozzle arm 43 is rotationally moved in the transverse direction by using the rotation driving unit 44, the nozzles 411 to 414 may be moved between a processing position at an upper side of the central portion of the wafer W held by the substrate holding mechanism 30 and a standby position retreated from the upper side of the wafer W to be on standby. A standby section 23 is provided at the standby position to put the nozzles 411 to 414 on standby. In FIG. 3, the nozzle head 42 and the nozzle arm 43 arranged at the processing position are indicated by solid lines, and the nozzle head 42 and the nozzle arm 43 arranged at the standby position are indicated by broken lines.

The chemical liquid nozzle 412 is connected to a chemical liquid source 72 via an opening/closing valve V2 and to a DIW source 73 via an opening/closing valve V3.

One or more kinds of chemical liquids to be supplied depending on the purpose of processing the front surface of the wafer W are supplied from the chemical liquid source 72. In the exemplary embodiment, one chemical liquid is used. The chemical liquid is supplied from the chemical liquid nozzle 412 via the opening/closing valve V2.

In addition, DIW is supplied from the chemical liquid nozzle 412 via the opening/closing valve V2. The chemical liquid nozzle 412 at the time of supplying the DIW corresponds to a DIW supply nozzle.

The IPA nozzle 411 is connected to an IPA source 71 via an opening/closing valve V1. IPA is supplied from the IPA source 71 at a timing before the water-repellent agent is supplied to the front surface of the wafer W, to replace the DIW. In general, the water-repellent agent is insoluble in DIW and does not mix with each other. Thus, even though the water-repellent agent is supplied to the front surface of the wafer W covered with DIW, replacement may be difficult in some cases. Further, some water-repellent agents react with water so that the water-repellency is lowered. Thus, when DIW is replaced with IPA having a mutual solubility with both DIW and water-repellent agent, it may be assured that the water-repellency processing of the front surface of the wafer W is performed by the subsequent supply of the water-repellent agent.

The IPA corresponds to the first solvent of the exemplary embodiment. The solvent that may be adopted as the first solvent is not limited to IPA, and may be an alcohol such as, for example, methanol or ethanol. The IPA nozzle 411 corresponds to the first solvent supply nozzle.

The water-repellent nozzle 414 is connected to a water-repellent agent unit 75 via an opening/closing valve V5. A water-repellent agent is supplied from the water-repellent agent supply unit 75 to impart water-repellency to the front surface of the wafer W, thereby reducing the surface tension acting on the pattern formed in the front surface of the wafer W. The water-repellent agent, which may be used herein, includes trimethylsilyl dimethylamine (TMSDMA), hexamethyldisilazane (HMDS), trimethylsilyl diethylamine (TMSDEA), dimethyl(dimethylamino)silane (DMSDMA), and 1,1,3,3-tetramethyldisilane (TMDS), each of which is diluted with a diluent to be used as the water-repellent agent. These water-repellent agents have a mutual solubility with IPA and HFO, which will be described later. The water-repellent agent nozzle 414 corresponds to the water-repellent agent supply nozzle.

The HFO nozzle 413 is connected to an HFO source 74 via the opening/closing valve V4. HFO is supplied from the HFO source 74 to replace the water-repellent agent remaining on the front surface of the wafer W after the water-repellency processing. HFO is a generic term for chemical substances in which a part or all of the hydrogen atoms in the olefin are substituted with fluorine atoms. Examples of HFO may include SINERA and SUPREYON (all US registered trademark of Chemours Company). In general, HFO has a mutual solubility with a water-repellent, but is insoluble in water. The HFO corresponds to the second solvent of the exemplary embodiment. The HFO nozzle 413 corresponds to the second solvent supply nozzle.

Further, from the viewpoint of the specific gravity of IPA, the water-repellent agent, and HFO which are sequentially supplied to the front surface of the wafer W after rinsing with DIW, the specific gravity of IPA (0.79 at 20° C.) is smaller than the specific gravity of the water-repellent agent (e.g., in the case of TMSDMA having a specific gravity of 0.75 at 20° C., diluted with a solvent (e.g., PGMEA) such that the specific gravity is set to be larger than 0.79 and smaller than 1.58). Meanwhile, the specific gravity of HFO (about 1.58 at the supply temperature (25° C.)) is larger than the specific gravity of the water-repellent agent.

The movement of each of the nozzles 411 to 414 between the standby position and the processing position, which has been described above with reference to FIG. 3, and the supply of the liquid from each of the sources 71 to 75 and the stop of the supply are performed by the controller 18 described above.

The contents of the liquid processing performed using the processing unit 16 having the above-described configuration will be described with reference to FIGS. 4 to 6.

Figure 5:
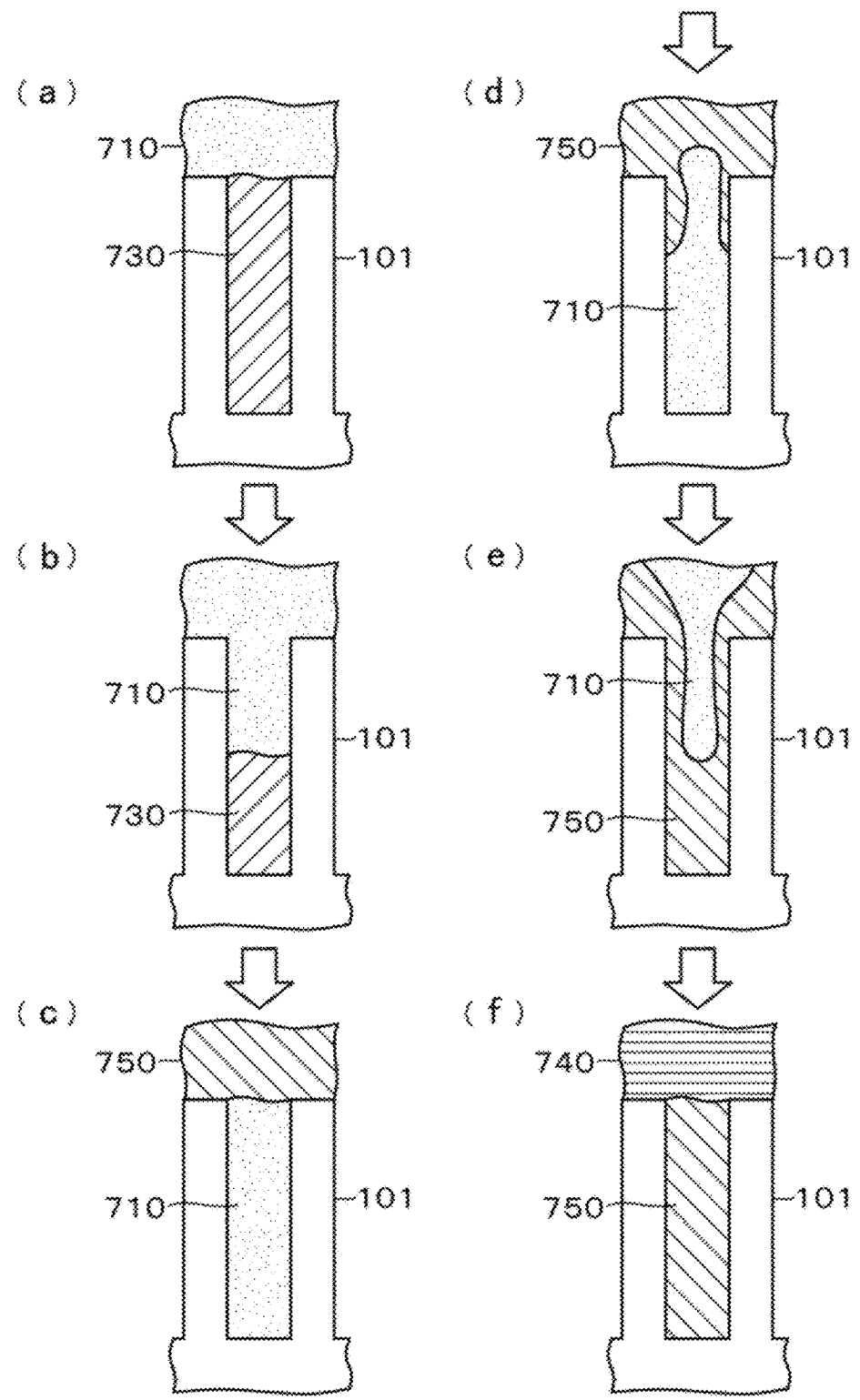
FIGS. 5(a)-5(f) are first action diagrams schematically illustrating a state of a front surface of a wafer after a chemical liquid processing.
Figure 6:
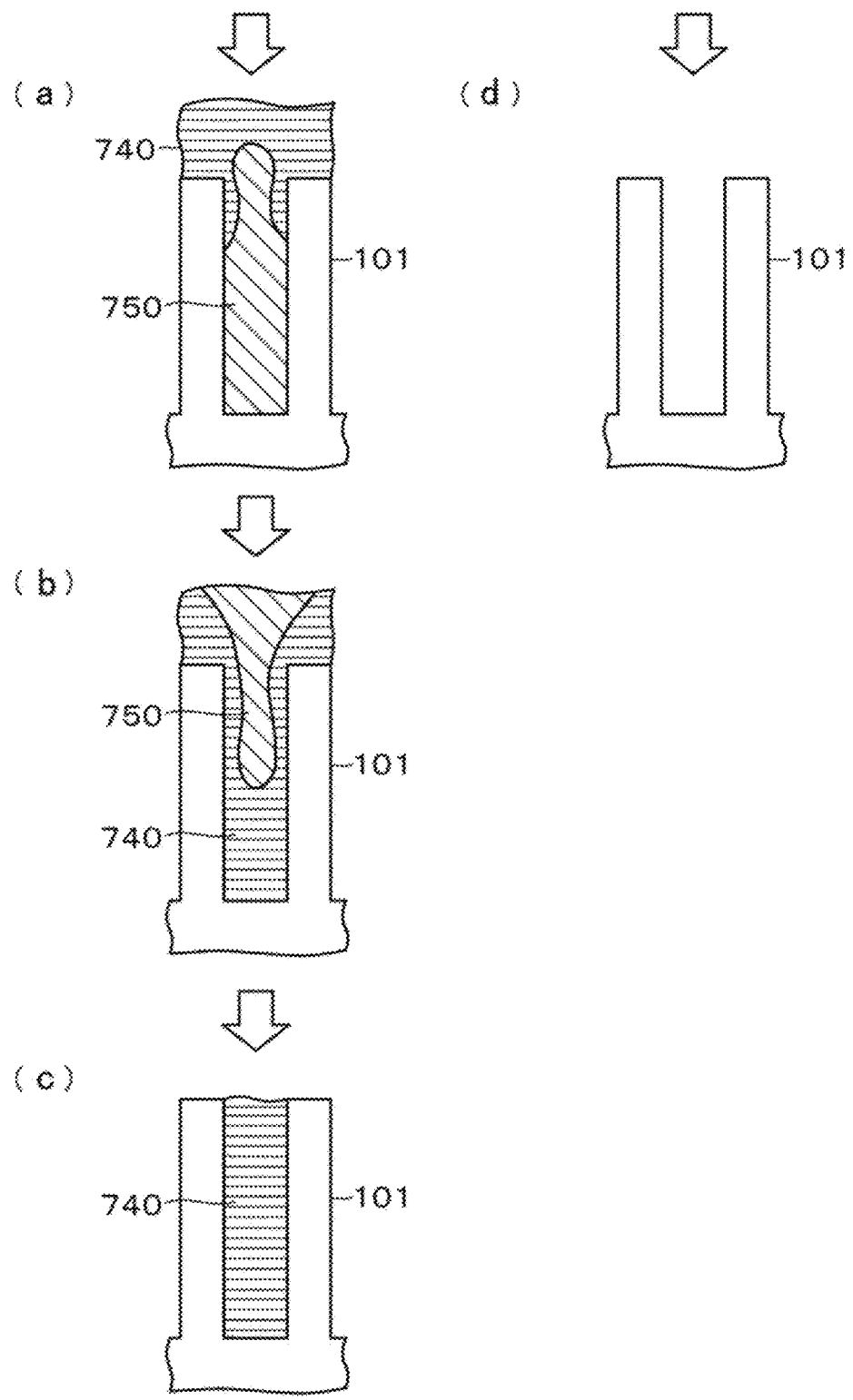
FIGS. 6(a)-6(d) are second action diagrams schematically illustrating a state of the front surface of the wafer.

FIGS. 5 and 6 schematically illustrate a state where liquids 710, 730, 740, 750 are successively replaced in a pattern 101 formed on the front surface of the wafer W. For the convenience of illustration, these schematic diagrams illustrate the interfaces between the liquids. However, in practice, such clear interfaces are not formed between liquids having a mutual solubility in many cases. Therefore, in order to facilitate the understanding of the action of the liquid processing according to the exemplary embodiment, FIGS. 5 and 6 simplify and schematize the state of replacement of the liquid expected to occur in the pattern 101, and do not express strictly the behavior of each liquid.

When the wafer W carried into the processing unit 16 by the substrate transfer device 17 is held by the substrate holding mechanism 30, the nozzle head 42 (each of the nozzles 411 to 414) which has been on standby at the standby position is moved to the processing position. Then, the wafer W is rotated at a predetermined rotation speed, and the chemical liquid is supplied from the chemical liquid nozzle 412 (processing P1 in FIG. 4).

Figure 4:
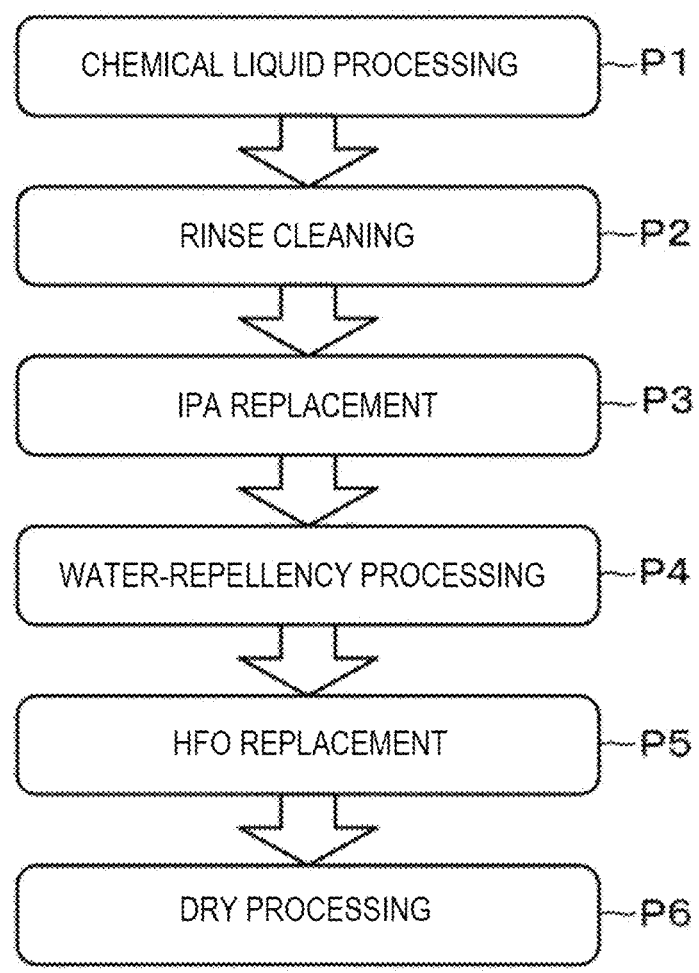
FIG. 4 is a flowchart of a liquid processing performed by the processing unit.

When the processing with the chemical liquid is completed, the liquid to be supplied from the chemical liquid nozzle 412 is switched to DIW, and rinse cleaning is performed (processing P2 in FIG. 4, deionized water supply step). Specifically, DIW is supplied to the central portion of the wafer W where the liquid film of the chemical liquid is present, while the wafer W is rotated. When the rinse cleaning is performed for a predetermined time, the supply of DIW from the chemical liquid nozzle 412 is stopped, and IPA is supplied from the IPA nozzle 411 to replace the DIW (processing P3 in FIG. 4, first solvent supply step). Specifically, the IPA is supplied to the central portion of the wafer W where the liquid film of the DIW is present, while the wafer W is rotated.

Since IPA and DIW have a high mutual solubility, when the IPA 710 is supplied onto the DIW 730 entering the pattern 101 of the wafer W as illustrated in part (a) of FIG. 5, the DIW is dissolved in the IPA and is pushed out of the wafer W by the IPA. Thus, the liquid in the pattern 101 is gradually replaced with the IPA 710 (see, e.g., part (b) of FIG. 5).

Then, the supply of the IPA from the IPA nozzle 411 is stopped at a timing when the DIW 730 in the pattern 101 is sufficiently replaced with the IPA 710, and the water-repellent agent is supplied from the water-repellent agent nozzle 414 to replace the IPA (processing P4 in FIG. 4, water-repellent agent supply step). Specifically, the water-repellent agent is supplied to the central portion of the wafer W where the liquid film of the DIW is present, while the wafer W is rotated.

The water-repellent agent has a specific gravity larger than that of the IPA. Therefore, as illustrated in part (c) of FIG. 5, the water-repellent agent 750 supplied to the front surface of the wafer W enters the pattern 101 while pushing out the IPA in the pattern 101 (see part (d) of FIG. 5). In addition, the hydrophobizing agent has a mutual solubility with the IPA. Therefore, even though the IPA remains in the pattern 101, dissolution in the water-repellent agent 750 progresses with the lapse of time, and the IPA in the pattern 101 is pushed out of the wafer W and replaced by the water-repellent agent 750 supplied from the water-repellent agent nozzle 414 (see part (e) of FIG. 5).

Accordingly, since IPA is replaced with a water-repellent agent that has a specific gravity larger than IPA, the IPA in the pattern 101 may be efficiently replaced with the water-repellent agent. Further, since the IPA, which may contain the DIW in the pattern 101 or moisture in the atmosphere due to the high mutual solubility with water, is sufficiently replaced with the water-repellent agent, the water-repellent ability of the water-repellent agent may be suppressed from being lowered due to the moisture contained in the IPA, and the effect of the water-repellency processing may be sufficiently exerted.

Then, the supply of the water-repellent agent from the water-repellent agent nozzle 414 is stopped at a timing when the IPA 710 in the pattern 101 is sufficiently replaced with the water-repellent agent 750 and the front surface of the wafer W containing the IPA 710 is sufficiently imparted with the water-repellency, and HFO is supplied from the HFO nozzle 413 (processing P5 in FIG. 4, second solvent supply step). Specifically, the HFO is supplied to the central portion of the wafer W where the liquid film of the water-repellent agent is present, while the wafer W is rotated. The HFO is supplied at normal temperature (e.g., 25° C.).

HFO has a specific gravity larger than that of the water-repellent agent. Therefore, as illustrated in part (f) of FIG. 5, the HFO 740 supplied to the front surface of the wafer W enters the pattern 101 while pushing out the water-repellent agent in the pattern 101 (see, e.g., part (a) of FIG. 6). Further, the HFO 740 has a mutual solubility with the water-repellent agent. Therefore, even though the water-repellent agent remains in the pattern 101, dissolution in the HFO 740 progresses with the lapse of time, and the water-repellent agent in the pattern 101 is pushed out of the wafer W and replaced by the HFO 740 supplied from the HFO nozzle 413 (see, e.g., part (b) of FIG. 6).

Accordingly, the water-repellent agent in the pattern 101 may be efficiently replaced with HFO by using HFO having a mutual solubility with the water-repellent agent and having a specific gravity larger than that of the water-repellent agent (see, e.g., part (c) of FIG. 6).

Then, the supply of the HFO from the HFO nozzle 413 is stopped at a timing when the water-repellent agent 750 in the pattern 101 is sufficiently replaced with the HFO 740, and a dry processing of the wafer W is performed by removing the HFO while the wafer W is rotated (processing P6 in FIG. 4, removal step).

Here, the present inventors have found that, when a water-repellency processing of the front surface of the wafer W is performed by supplying a water-repellent agent to the front surface of the wafer W and a dry processing is then performed without replacing the water-repellent agent with another solvent, dry residue of the water-repellent agent may remain as particles on the front surface of the wafer W. In this regard, when HFO having a larger specific gravity than the water-repellent agent is used to sufficiently replace the water-repellent agent 750 in the pattern 101 with the HFO 740, the water-repellent agent 750 may be suppressed from remaining on the front surface of the wafer W, thereby suppressing the particle contamination thereof.

Further, HFO has a low mutual solubility with water (water insoluble), as compared with IPA. Therefore, it is difficult to absorb moisture in the atmosphere, as compared with a case where IPA is adopted as the solvent to be replaced with the water-repellent agent. Accordingly, a problem may scarcely arise in that a mixed liquid of a solvent (e.g., IPA) and moisture absorbed from the atmosphere is formed in the pattern 101, and the solvent component is dried first in the dry process so that a large amount of moisture is contained in the mixed liquid, from which the surface tension causes pattern collapse.

Further, while the surface tension of HFO (25° C.) is smaller than 17 mN/m, the surface tension of IPA (25° C.) is about 20 mN/m. Even in this regard, the force acting on the pattern 101 is smaller than that in the case where IPA is used as the solvent to be replaced with the water-repellent agent.

Further, as described above, since HFO has a low mutual solubility with DIW, the DIW in the pattern 101 may be hardly replaced therewith, and the moisture may lower the ability of the water-repellent agent. Therefore, when HFO is used for the replacement of DIW in the processing before supplying the water-repellent agent (the processing corresponding to processing P3 in FIG. 4), the water-repellent agent is supplied in a state where the DIW remains in the pattern 101, which may cause degradation of the water-repellent and generation of particles due to watermark.

After the supply of the HFO from the HFO nozzle 413 is stopped and the dry processing of the wafer W is performed for a predetermined time to sufficiently remove the HFO on the front surface of the wafer W, the rotation of the wafer W is stopped, and the liquid process is completed. Thereafter, the wafer W is carried out from the processing unit 16 in a procedure opposite to that at the time of the carry-in.

According to the exemplary embodiment, the following effects are obtained. Since the specific gravities of IPA, the water-repellent agent, and HFO increase in the supplying order thereof to the wafer W, the previously supplied liquid may be removed from the front surface of the wafer W by utilizing the difference in specific gravity. Further, since different solvents (e.g., IPA as the first solvent and HFO as the second solvent) are used for removal of the deionized water used in the rinse cleaning and removal of the water-repellent agent for imparting water-repellency to the front surface of the wafer W, solvents suitable for removal of the respective liquids (DIW and water-repellent agent) may be selected.

Here, the HFO used for replacement with the water-repellent agent is not limited to the case where it is supplied to the wafer W at normal temperature. For example, a heater (second solvent heating unit) may be provided in the HFO source 74, and HFO heated to a temperature higher than the boiling point of IPA (first solvent) may be supplied to the wafer W. For example, the boiling points of SINERA and SUPRION exemplified as HFO are both 110.5° C. Thus, they may be heated to a temperature higher than the boiling point of IPA (82.4° C.). When HFO is heated to near 100° C., the surface tension is less than about 10 mN/m, and the force acting on the pattern 101 is smaller than that HFO at normal temperature (25° C.). Therefore, problems such as pattern collapse more hardly occur. When HFO having a larger specific gravity than that of the water-repellent agent is supplied, the water-repellent agent may be suppressed from remaining in the pattern 101 after the HFO replacement, thereby reducing the occurrence of particle contamination caused by drying of the HFO.

As a result of a preliminary test in which heated HFO (100° C.) and IPA (70° C.) were added dropwise to the front surface of the wafer W, the HFO heated to 100° C. was evaporated within several seconds. On the other hand, the IPA was gradually evaporated, and thus, the time to dry was longer than that required for the HFO. Since the possibility of pattern collapse increases as the time to apply a force to the pattern 101 becomes longer, HFO, which is removable within a shorter time as compared with the case where IPA is used as the solvent to be replaced with the water-repellent agent, is considerably effective in suppressing the occurrence of pattern collapse even in this regard. Even for the HFO which is easy to dry, it has been found that, when a sufficient amount of HFO is supplied continuously from the HFO nozzle 413, a liquid film of HFO may be formed on the front surface of the wafer W.

Further, the liquid which is adoptable as the second solvent is not limited to HFO, and may be HFE or HFC. Even with these substances, when the specific gravity at the supply temperature to the surface of the wafer W is higher than that of the water-repellent agent, the effect of replacing the water-repellent agent in the pattern 101 will be high. Further, in a case where the second solvent have a mutual solubility with the water-repellent agent and are insoluble in water, the replacement property of HFO also becomes higher. Thus, it is possible to reduce the occurrence of pattern collapse due to the formation of a mixed liquid containing water by absorbing moisture in the atmosphere.

Next, descriptions will be made on a configuration example and operation of an HFO supply mechanism provided with an HFO heating unit 74b, which is a second solvent heating unit, with respect to the HFO source 74 illustrated in FIG. 3, with reference to FIGS. 7 to 10.

Figure 7:
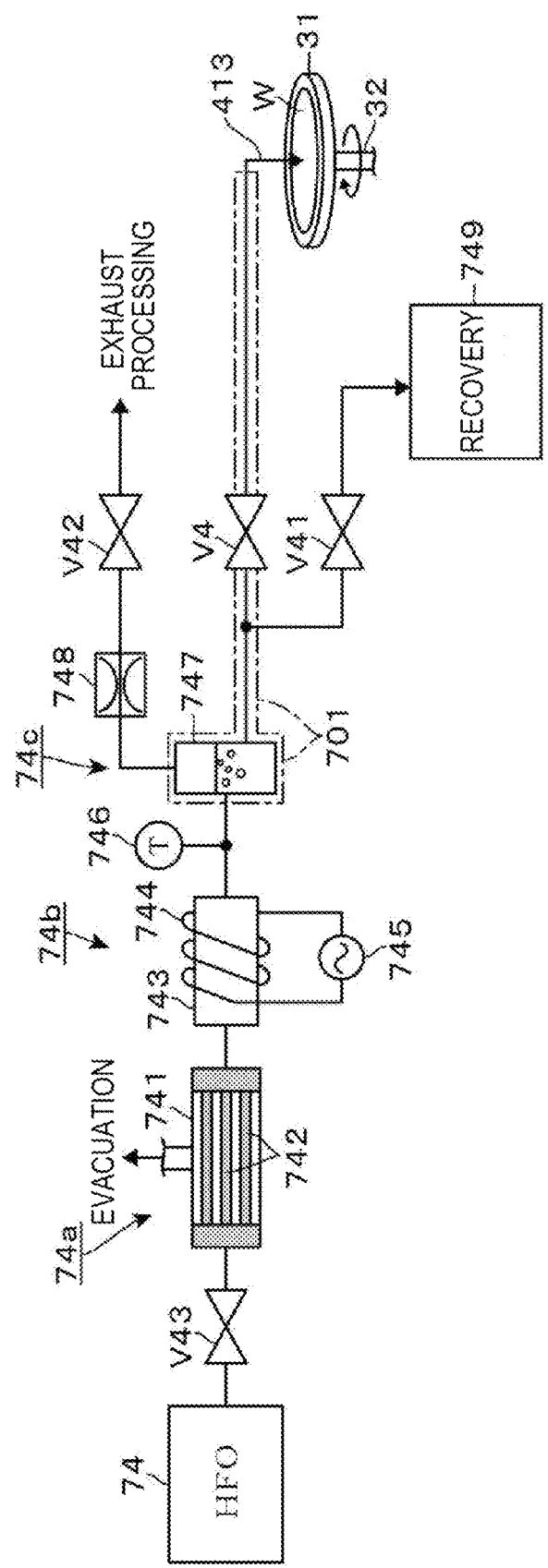
FIG. 7 is a configuration diagram of an HFO supply mechanism that supplies heated HFO.

A degassing unit 74a is provided downstream of the HFO source 74 illustrated in FIG. 7 via an opening/closing valve V43 to remove the dissolved gas dissolved in the HFO stored in the HFO source 74. The degassing unit 74a accommodates a large number of hollow fiber membranes 742 made of a resin material such as, for example, polytetrafluoroethylene (PTFE) in a main body 741, and has a structure in which a space inside each of the hollow fiber membranes 742 through which HFO flows and a space outside the hollow fiber membranes 742 are separated. The HFO supplied from the HFO source 74 is caused to flow from one end side of the bundle of the hollow fiber membranes 742 toward the other end side, and the inside of the main body 741 is evacuated so that the gas dissolved in the HFO is discharged toward the evacuated side outside the main body 741 through the hollow fiber membranes 742. The HFO having passed through the degassing unit 74a is sent to the downstream side of the degassing unit 74a.

An HFO heating unit 74b is provided at a downstream side of the degassing unit 74a to heat the HFO. The HFO heating unit 74b heats the HFO such that the temperature of the HFO measured by a thermometer 746 provided at the outlet side thereof becomes a preset temperature. There is no particular limitation on the method of heating the HFO. However, the HFO heating unit 74b illustrated in FIG. 7 adopts a dielectric heating method in which heating of the HFO flowing through the heating container 743 is performed using a coil 744 to which a high frequency power is applied from a high frequency power supply 745.

Here, the inventors have found that, although the HFO supplied to the HFO heating unit 74b has been degassed in advance by the degassing unit 74a, bubbles of a visually observable size may be contained in the HFO at the outlet side of the HFO heating unit 74b, for example, when the set temperature is set to be close to 100° C. It is considered that the bubbles have grown (expanded) when the dissolved gas, which was not completely removed in the degassing unit 74a, was heated in the HFO heating unit 74b.

When bubble-containing HFO is supplied to the HFO nozzle 413, a measurement error of the HFO supply flow rate may be caused. Further, defects may be generated due to the supply of the bubble-containing HFO to the front surface of the wafer W. Furthermore, contamination within the processing unit 16 may occur due to splash generated when the bubbles burst at the outlet of the HFO nozzle 413.

Meanwhile, when the cause of generation of bubbles is the heating of HFO by the HFO heating unit 74b, the degassing unit 74a may be provided at the subsequent stage of the HFO heating unit 74b to remove the dissolved gas in the HFO together with the grown bubbles. However, as described above, since the hollow fiber membranes 742 are made of a resin material such as PTFE, the resin may be eluted into the solvent such as HFO. Particularly, it has been confirmed that, when HFO as a solvent is heated to, for example, near 100° C. and supplied to the hollow fiber membranes 742 made of a resin material, a part of the resin constituting the hollow fiber membranes 742 may be eluted into the HFO and become particles.

Therefore, the supply mechanism of HFO of the exemplary embodiment further includes a gas-liquid separating unit 74c at the downstream side of the HFO heating unit 74b to separate the bubbles from the HFO heated by the HFO heating unit 74b.

For example, the gas-liquid separating unit 74c includes a cylindrical gas-liquid separating container 747 which is arranged vertically in the closed state at both upper and lower sides. A line through which the HFO flowing out from the HFO heating unit 74b flows is connected to a height position of the middle stage of the lateral surface of the gas-liquid separating container 747. Further, a line for supplying the HFO after the gas-liquid separation is connected to the HFO nozzle 413 at the lower side of the gas-liquid separating container 747, while a line for extracting and exhausting the gas separated from the HFO is connected at the upper side of the gas-liquid separation container 747.

The line for exhausting the gas is provided with a pressure adjustor 748 constituted by, for example, an orifice or a needle valve (in FIG. 7, an orifice is provided as the pressure adjustor 748). The pressure adjustor 748 functions to adjust the pressure inside the gas-liquid separating container 747 such that gas bubbles in the HFO flowing into the gas-liquid separating container 747 further grow, thereby facilitating the gas-liquid separation due to the difference in specific gravity between the HFO and the bubbles. An opening/closing valve V42 is provided at the downstream side of the pressure adjustor 748, and the downstream side thereof is connected to an exhaust processing equipment (not illustrated).

Meanwhile, the line for supplying the HFO, from which the bubbles have been separated, to the HFO nozzle 413 is branched at the upstream side of the opening/closing valve V4. This branch line is connected to a solvent recovery unit 749 via an opening/closing valve V41.

Further, a heating unit 701 including, for example, a tape heater is provided in the main body of the gas-liquid separating container 747 of the gas-liquid separating unit 74c or in a pipe from the gas-liquid separating container 747 to the HFO nozzle 413 such that the HFO of a preset temperature (e.g., 100° C.) is ejected from the HFO nozzle 413. Further, instead of providing the heating unit 701, heat insulation of the gas-liquid separating container 747 and the pipe may be performed.

The operation of the HFO supply mechanism having the above-described configuration will be described.

First, the HFO supply mechanism is on standby in a state where the opening/closing valve V43 at the downstream side of the HFO source 74 is closed to stop the supply of the HFO, and the HFO heating unit 74b is turned OFF (not illustrated).

Figure 8:
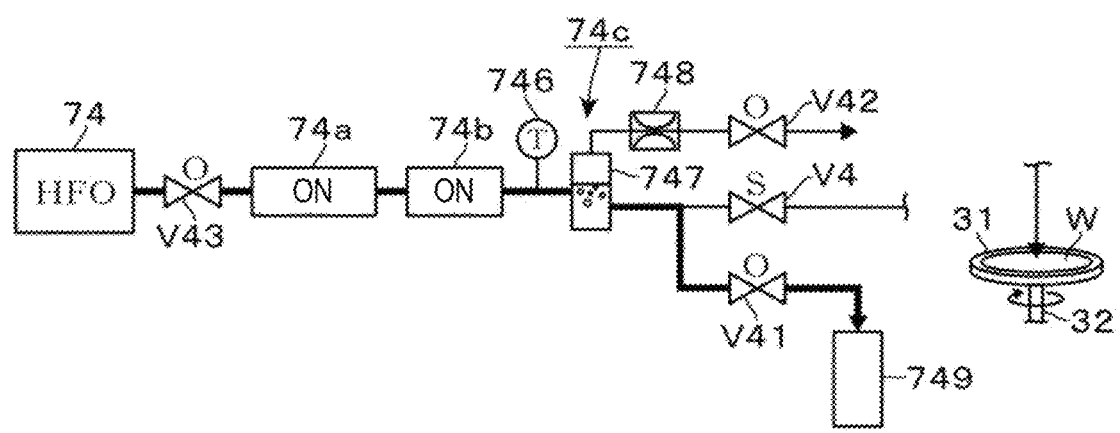
FIG. 8 is a first action diagram of the HFO supply mechanism.

Meanwhile, at the processing unit 16 side, the chemical liquid processing P1 to the water-repellency processing P4 are sequentially performed on the wafer W according to the procedure described with reference to FIG. 4. Then, the opening/closing valve V43 is opened at a timing, which is earlier by a predetermined time than the time when the supply of the HFO from the HFO nozzle 413 (HFO replacement processing P5) is started, to supply the HFO to the downstream side of the HFO source 74, and degassing of the HFO by the degassing unit 74a and heating of the HFO by the HFO heating unit 74b are started (FIG. 8).

As the temperature of HFO increases, the HFO at the outlet side of the HFO heating unit 74b contains bubbles. The bubble-containing HFO flows into the gas-liquid separating container 747 of the gas-liquid separating unit 74c, and is then temporarily stored in a region at the lower side of the gas-liquid separating container 747. The bubbles having a smaller specific gravity than that of the HFO rise in the liquid reservoir of the HFO such that the bubbles are discharged to the space at the upper side in the gas-liquid separating container 747 and then exhausted to the outside via an exhaust line.

The HFO from which the bubbles are separated is extracted from the gas-liquid separating container 747. However, the HFO is discharged toward the solvent recovery unit 749 until the timing when the temperature of the HFO reaches the set temperature and the HFO replacement processing P5 is started.

Figure 9:
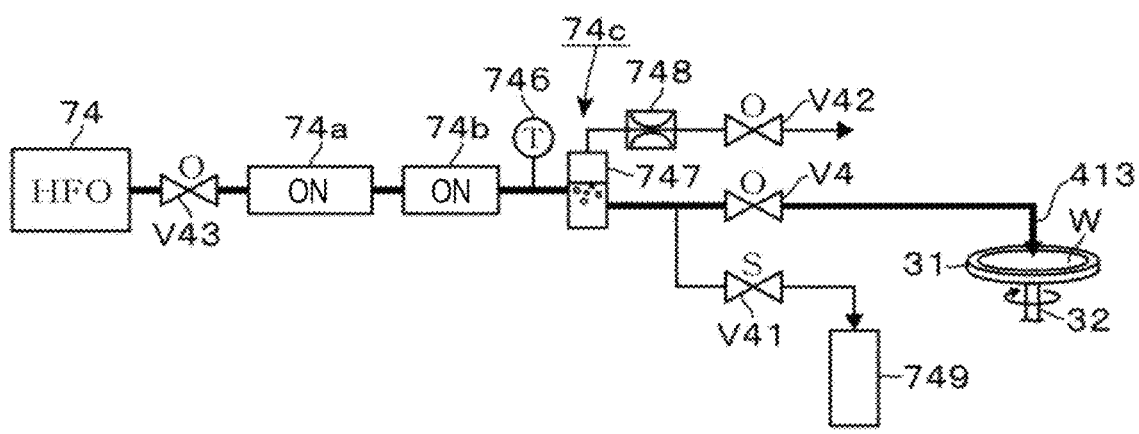
FIG. 9 is a second action diagram of the HFO supply mechanism.

Then, the opening/closing valve V4 at the HFO nozzle 413 side is opened at the timing when the temperature of the HFO reaches the set temperature and the HFO replacement processing P5 is started, while the opening/closing valve V41 at the branch line side is closed to start the supply the heated HFO to the wafer W (FIG. 9). As a result, the replacement of the water-repellent agent 750 and the HFO 740 is performed on the front surface of the wafer W based on the action described with reference to part (f) of FIG. 5 to part (c) of FIG. 6.

Even during the HFO replacement processing P5, since the bubbles grown with the heating of the HFO are removed in the gas-liquid separating unit 74c, HFO from which bubbles have been removed is supplied to the wafer W. Thus, it is possible to suppress occurrence of various problems caused by the supply of the bubble-containing HFO.

Figure 10:
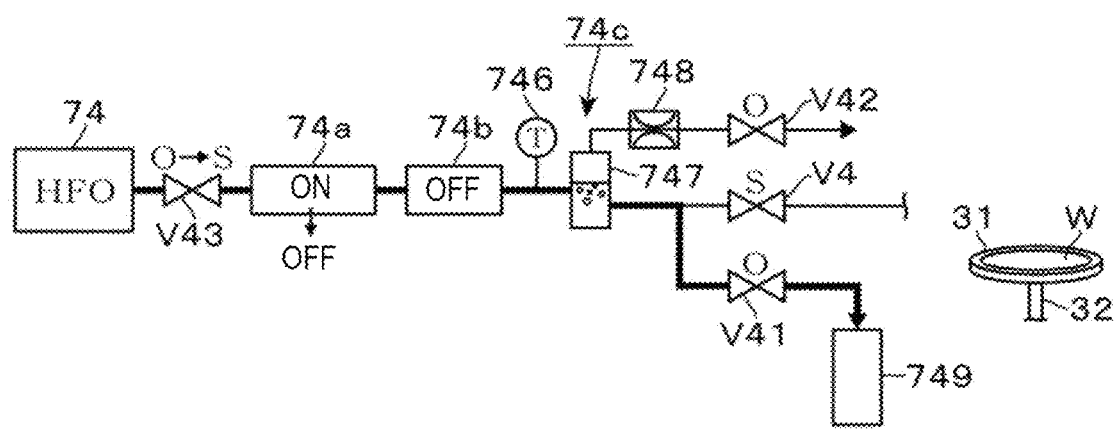
FIG. 10 is a third action diagram of the HFO supply mechanism.

When the supply of the HFO (HFO replacement processing P5) is performed for a predetermined time, the HFO discharge destination from the gas-liquid separating container 747 is switched again to the branch line side. Then, the heating by the HFO heating unit 74b is terminated, and the discharge of the HFO to the solvent recovery unit 749 side is continued until the temperature of the HFO at the outlet of the HFO heating unit 74b decreases to a temperature in the range of, for example, room temperature to about 60° C. (FIG. 10). When the temperature of the HFO decreases, the opening/closing valve V43 at the downstream side of the HFO source 74 is closed and the degassing of the HFO by the degassing unit 74a is terminated. Then the timing of performing the HFO replacement processing P5 for the next wafer W is awaited.

As for the HFO supply mechanism described with reference to FIGS. 7 to 10, descriptions have been made on an example in which the degassing unit 74a utilizing the hollow fiber membranes 742 is provided in front of the HFO heating unit 74b.

Meanwhile, when the degassing of the HFO stored in the HFO source 74 is completed, for example, due to degassing at the manufacturer side of the HFO, the installation of the degassing unit 74a in front of the HFO heating unit 74b may be omitted. Even in this case, since bubbles may grow when heating the HFO in some cases, the HFO with the separated bubbles may be supplied to the HFO nozzle 413 by providing the gas-liquid separating unit 74c at the subsequent stage of the HFO heating unit 74b.

In another exemplary embodiment, an etching gas may be supplied to the front surface of the wafer W which has been subjected to the dry processing P6. The wafer W to which the water-repellent agent is supplied may be subjected to a processing of oxidizing the front surface of the wafer W with an acidic chemical liquid such as, for example, ozone water during the chemical liquid processing P1. Further, after the water-repellency processing P4 of the wafer W is performed using the water-repellent agent, a water-repellent functional group, for example, a silyl group containing a Si atom may be present on the front surface of the wafer W in some cases.

The oxide film formed by the surface oxidation of the wafer W and the silyl group present on the front surface of the wafer W may cause a film formation failure in the film forming step in the subsequent stage and a deterioration of the electrical characteristics of the wafer W. Therefore, occurrence of problems caused by the presence of the oxide film or the functional group may be suppressed by supplying an etching gas (e.g., hydrogen fluoride gas) to the front surface of the wafer W which has been subjected to the dry processing P6 so that the oxide film and the unnecessary functional groups such as, for example, the silyl group are etched and removed.

Subsequently, in the case where the HFO replacement is performed by supplying the heated HFO by the HFO heating unit 74b (second solvent supply step), descriptions will be made on an exemplary embodiment in which the risk of occurrence of pattern collapse of the front surface of the wafer W is reduced when performing the dry processing (HFO removal step) P6 of the wafer W. In this exemplary embodiment, after supplying the heated HFO to the central portion of the rotating wafer W and performing the HFO replacement processing P5, the supply position of the HFO from the HFO nozzle 413 is moved from the central portion side of the rotating wafer W to the peripheral portion side to remove the HFO from the front surface of the wafer W (dry processing P6).

Figure 11:
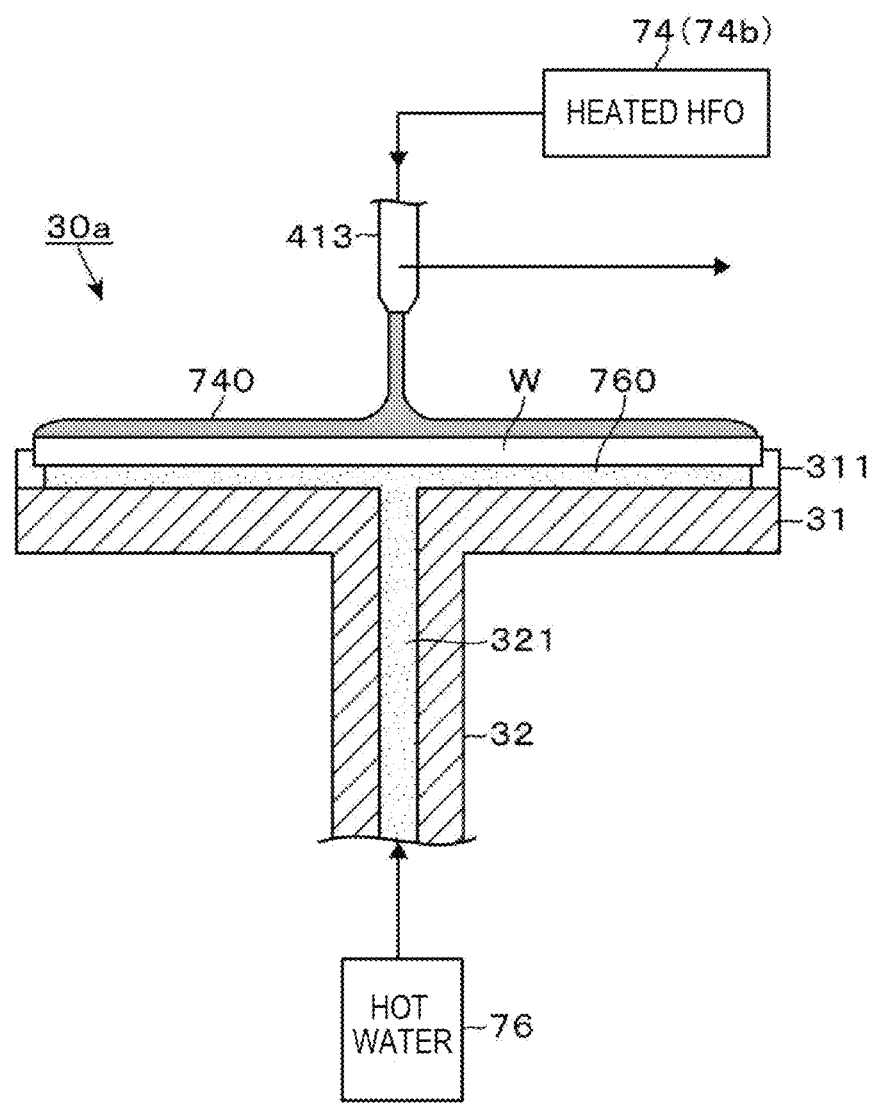
FIG. 11 is a view illustrating a configuration of a processing unit provided with a rear surface heating mechanism.

In this case, as illustrated in FIG. 11, the supply of the HFO is performed using a supply mechanism including, for example, the processing fluid supply unit 40 (HFO nozzle 413) illustrated in FIGS. 2 and 3, the HFO source 74, and the HFO heating unit 74b illustrated in FIG. 7. In the substrate holding mechanism 30a of the exemplary embodiment, the wafer W is held by a plurality of support pins 311 provided in the holding unit 31, and a gap is formed between the upper surface of the holding unit 31 and the rear surface of the wafer W.

Further, a hot water flow path 321 is formed in the support unit 32 and the holding unit 31 to supply a heated fluid from the lower position of the central portion of the wafer W toward the gap. A hot water source 76 is connected to the upstream side of the hot water flow path 321 to supply hot DIW which is a fluid heated to a temperature lower than the boiling point (100° C.) and not lower than 50° C. (e.g., 75° C.). The hot water is supplied in a state of being heated to a temperature lower than the liquid temperature of the HFO.

When the hot water is supplied from the hot water flow path 321 while the wafer W is rotated by rotating the support unit 32, the hot water expands into the gap. Thus, the hot water may be supplied to the entire rear surface of the wafer W.

Heating of the wafer W with hot water is performed in order to reduce the risk of the occurrence of pattern collapse of the front surface of the wafer W when performing the dry processing (HFO removal step) P6 of the wafer W after the HFO replacement processing P5 by the heated HFO.

As described above, in the exemplary embodiment, after supplying the heated HFO to the central portion of the rotating wafer W and performing the HFO replacement processing P5, the supply position of the HFO from the HFO nozzle 413 is moved from the central portion side of the rotating wafer W to the peripheral portion side to remove the HFO from the front surface of the wafer W (dry processing P6).

First, it is assumed that no temperature adjustment is performed when the supply position of the HFO is moved from the central portion side of the wafer W to the peripheral portion side after the replacement of the water-repellent agent is performed by supplying the heated HFO. When this method is adopted, it has been confirmed that there is a tendency that the risk of the occurrence of pattern collapse gradually increases from the central portion side in the plane of the wafer W to the peripheral portion side.

When the heated HFO is supplied while the wafer W is rotated, the tangential speed at each position on the front surface of the wafer W increases toward the peripheral portion side of the wafer W, and the supply amount of the heated HFO per unit area decreases. As a result, it is considered that, since the influence of the air cooling of the HFO by the atmosphere around the wafer W increases, the surface tension increases as the temperature decrement of the HFO increases, and as a result, the risk of the occurrence of pattern collapse toward the periphery side increases.

Therefore, the substrate holding mechanism 30a of the exemplary embodiment includes a rear surface heating mechanism that supplies hot water from the hot water flow path 321 to the rear surface side of the wafer W so as to suppress temperature decrease of the wafer W when the removal of the HFO is performed while the HFO supply position is moved, thereby suppressing the occurrence of pattern collapse.

Therefore, in the substrate holding mechanism 30a having a mechanism for supplying hot water to the rear surface side of the wafer W, the hot water may be supplied to the rear surface side of the wafer W during the removal of the HFO while the supply position of HFO is moved. When the hot water is constantly supplied during the removal of the HFO, the risk of the occurrence of pattern collapse may be reduced at the peripheral portion side of the wafer W, as compared with the case where no hot water is supplied.

Figure 21:
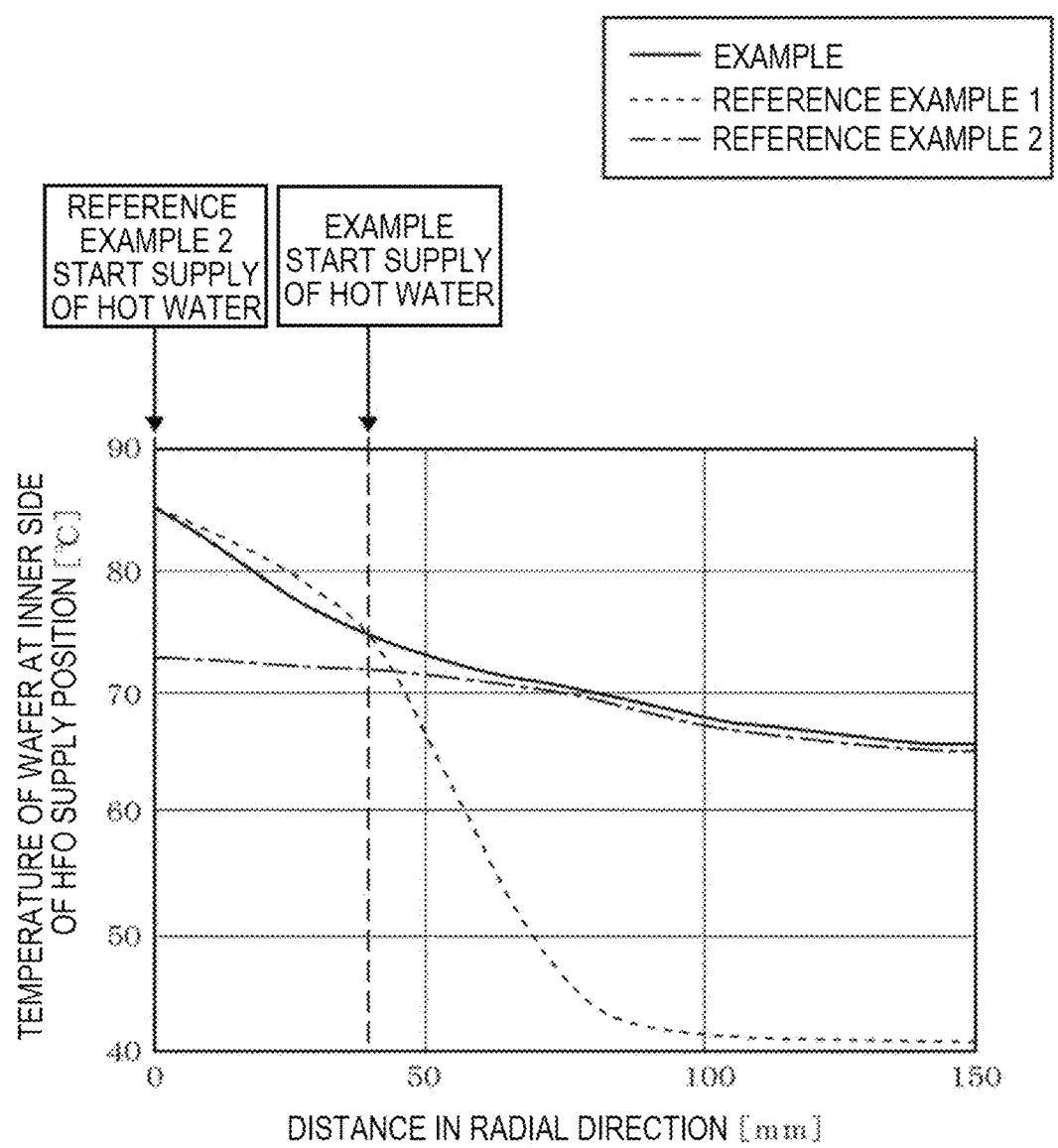
FIG. 21 is a view representing a test result for a temperature change of a dried interface at the time of the supply of the heated HFO.

Meanwhile, it has been confirmed that, when the hot water is constantly supplied, the temperature at the central portion side of the wafer W tends to decrease as compared with the case where no hot water is supplied (FIG. 21). When the temperature is relatively low, the risk of the occurrence of pattern collapse relatively increases. However, it is a matter of course that when the heated HFO is supplied regardless of whether or not hot water is supplied from the rear surface side of the wafer W, the number of the occurrence of pattern collapse may be reduced as compared with the case where the HFO is not heated.

It is considered that the reason why the temperature of the central portion of the wafer W is lowered is that when the temperature of the hot water supplied to the rear surface of the wafer W is lower than the temperature of the heated HFO, the hot water cools the heated HFO. That is, the hot water is supplied at a temperature lower than the boiling point (e.g., 75° C.) from the viewpoint of prevention of boiling of DIW and constraint of equipment. On the other hand, when the heated HFO is supplied at a temperature higher than that of the hot water, the HFO on the wafer W may be cooled by the hot water supplied to the rear surface side, in a region where the temperature of the HFO supplied to the wafer W is kept at a relatively high temperature, that is, in a region at the central portion side of the wafer W. In this case, it is considered that, when the influence of the cooling of the HFO by the hot water increases, the surface tension of the HFO increases, and as a result, the risk of the occurrence of pattern collapse relatively increases at the central portion side of the wafer W.

Based on the phenomena, the processing unit 16 provided with the substrate holding mechanism 30a of the exemplary embodiment starts the supply of the hot water to the rear surface of the wafer W at an appropriate timing, thereby drawing out an effect of reducing the surface tension by the supply of the heated HFO.

Descriptions will be made on a processing performed on the wafer W using the above-described substrate holding mechanism 30a with reference to parts (a) to (d) of FIG. 12. For the convenience of illustration, the descriptions of the holding unit 31 and the support unit 32 will be omitted in parts (a) to (d) of FIG. 12.

A processing of replacing the water-repellent agent is performed by disposing the HFO nozzle 413 at the upper side of the central portion of the wafer W and supplying the heated HFO to the front surface of the wafer W to which the water-repellent agent is supplied (HFO replacement processing P5 in FIG. 4). After the HFO replacement processing is performed for a predetermined time, the removal of the HFO (dry processing P6) is started by moving the HFO nozzle 413 from the central portion side to the peripheral portion side (part (a) of FIG. 12).

As the HFO nozzle 413 is moved, a remaining liquid film 740a is formed in a region at the central portion side of the wafer W which has a relatively small centrifugal force acting on the HFO 740. The remaining liquid film 740a is thinner than the liquid film (HFO 740 in FIG. 12) formed on the outer peripheral side of the HFO supply position. When hot water, which is lower in temperature than the heated HFO is supplied to the rear surface of the wafer W while the residual liquid film 740 a is present, the temperature of the HFO constituting the remaining liquid film 740a decreases and the surface tension becomes large. Thus, when the HFO is evaporated, the pattern collapse is likely to occur.

Figure 12:
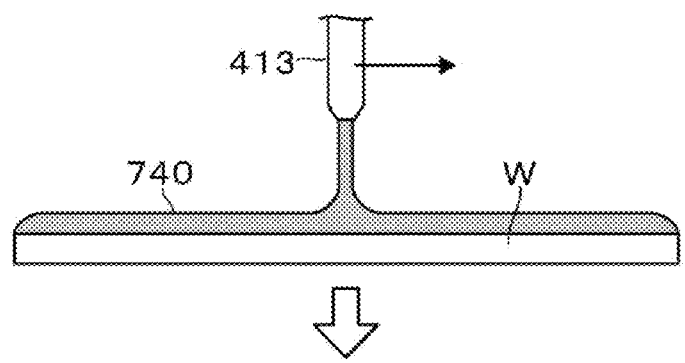
FIGS. 12(a)-12(d) are action diagrams of a wafer processing by supply of heated HFO in combination of rear surface heating.
Figure 12:
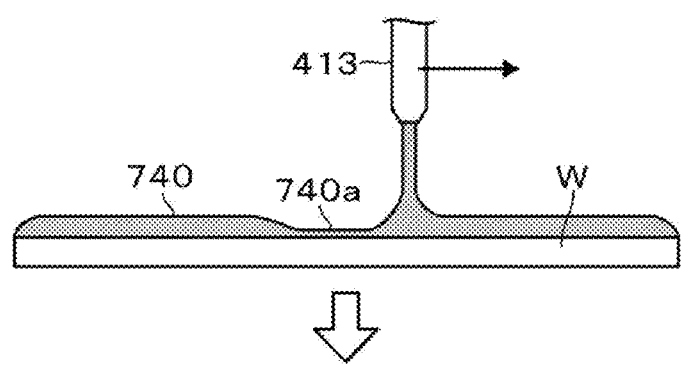
Figure 12:
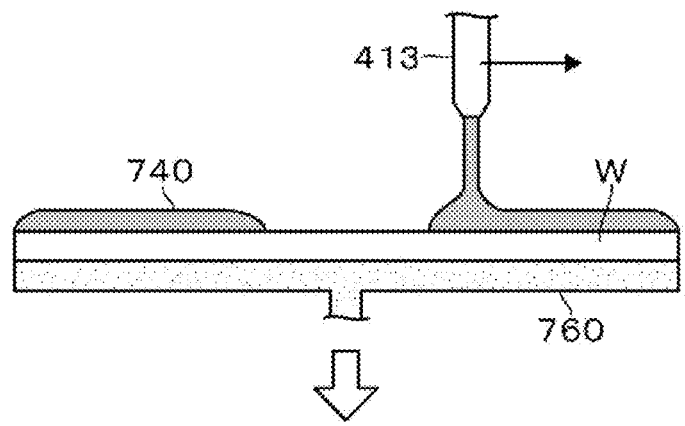
Figure 12:
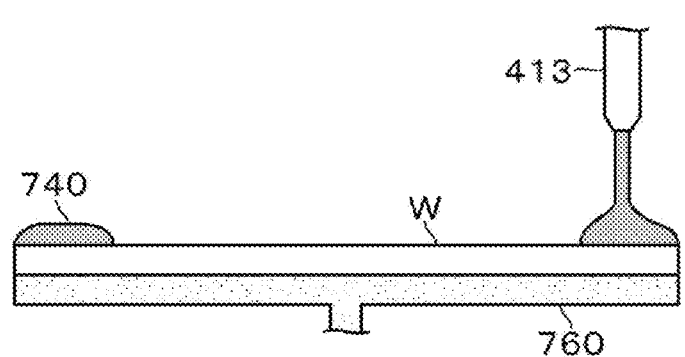

Therefore, during the period in which the remaining liquid film 740a of the HFO is formed in the region on the central portion side of the wafer W, it is awaited for the remaining liquid film 740a to disappear from the wafer W by the centrifugal force and volatilization without supplying the hot water to the rear surface side of the wafer W (part (b) of FIG. 12). The wording "the remaining liquid film 740a disappears" refers to a state in which the existence of the remaining liquid film 740a cannot be confirmed when the rotating wafer W is visually observed while the HFO supply position is moved.

Here, the movement speed of the HFO nozzle 413, which is moved from the central portion side of the wafer W to the peripheral portion side, may be set to the extent that the HFO nozzle 413 does not reach the peripheral portion side of the wafer W at the time when the remaining liquid film 740a is volatilized. When the movement speed of the HFO nozzle 413 is excessively increased, the HFO nozzle 413 reaches the peripheral portion side of the wafer W before the supply of the hot water to the rear surface side of the wafer W is started. Thus, the risk of the occurrence of pattern collapse may increase. More specifically, the movement speed of the HFO nozzle 413 may be set to the extent that the HFO nozzle 413 is located inside the half of the radius of the wafer W at the time when the remaining liquid film 740a in the region on the central portion side disappears from the wafer W. The movement speed of the HFO nozzle 413 may be constant on the movement path of the HFO nozzle 413 which is moved from the central portion side of the wafer W to the peripheral portion side, and the movement speed may be changed during the movement.

Then, the supply of hot water from the hot water flow path 321 to the rear surface of the wafer W is started at the time when the remaining liquid film 740a in the region on the central portion side where HFO is no longer supplied disappears from the wafer W (part (c) of FIG. 12). When the movement speed of the HFO nozzle 413 is constant (in the case of changing the movement speed of the HFO nozzle 413, the changing process of the movement speed is the same) for each wafer W, and the discharge flow rate of the HFO 740 from the HFO nozzle 413 or the conditions such as the rotation speed of the wafer W are satisfied, the position of the HFO nozzle 413 on the movement path from the central portion side to the peripheral portion side at the time when the remaining liquid film 740a disappears from the wafer W is substantially constant even when other wafers W are processed.

Therefore, in the processing unit 16 of the exemplary embodiment, the time when the remaining liquid film 740a in the central region of the wafer W disappears from the wafer W and the position of the HFO nozzle 413 on the movement path at that time are determined through, for example, a preliminary test. Then, when each wafer W is processed, the supply of the hot water to the rear surface of the wafer W is started at the time when the HFO nozzle 413 reaches a preset position on the movement path, based on the correspondence relation.

Even after the supply of the hot water to the rear surface of the wafer W is started, the HFO nozzle 413 is moved toward the peripheral portion side of the wafer W along the movement path while discharging the HFO (part (d) of FIG. 12). The temperature decrease of the HFO due to the influence of the air cooling is alleviated at the peripheral portion side of the wafer W by the supply of the hot water, so that the increase of the surface tension of the HFO is suppressed. Thus, the occurrence of pattern collapse may be suppressed.

After the HFO nozzle 413 reaches the peripheral portion of the wafer W, the supply of the HFO from the HFO nozzle 413 and the supply of the hot water from the hot water flow path 321 are stopped, while the remaining HFO or the hot water is shaken off by continuing the rotation of the wafer W. Thereafter, the rotation of the wafer W is stopped.

Here, the heated fluid to be supplied to the rear surface of the wafer W is not limited to the hot water. For example, heated HFO may be used, or temperature decrease of the wafer W may be suppressed by heated gas, for example, heated clean air.

Next, descriptions will be made on various reference modes equipped with a mechanism that suppresses a deterioration in water-repellent ability which is caused when the water-repellent agent (e.g., TMSDMA) within the water-repellent agent nozzle 414 comes in contact with moisture in the atmosphere.

The processing unit 16, which is a liquid processing apparatus, includes an atmospheric blocking mechanism that suppresses entry of atmosphere containing moisture into the water-repellent agent nozzle during a period in which the water-repellent agent is not supplied from the water-repellent agent nozzle 414.

Figure 13:
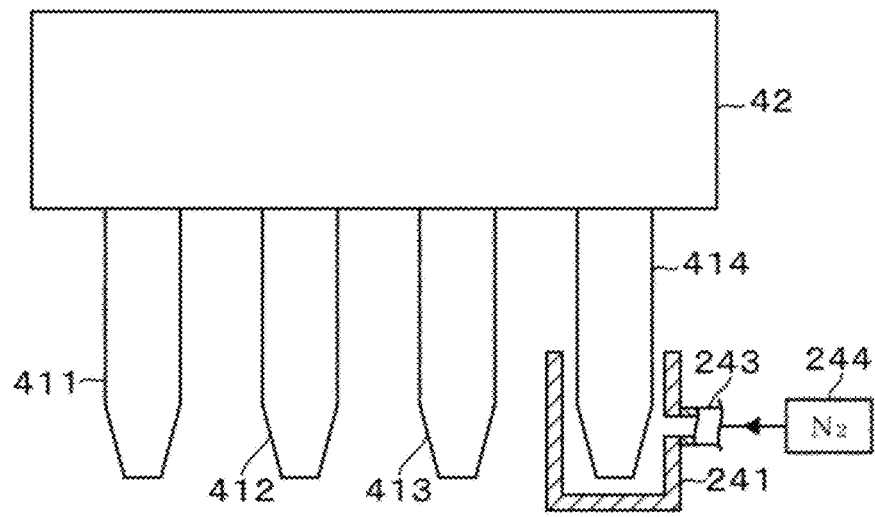
FIG. 13 is a view illustrating a first configuration example of a standby cap of a water-repellent agent nozzle.
Figure 14:
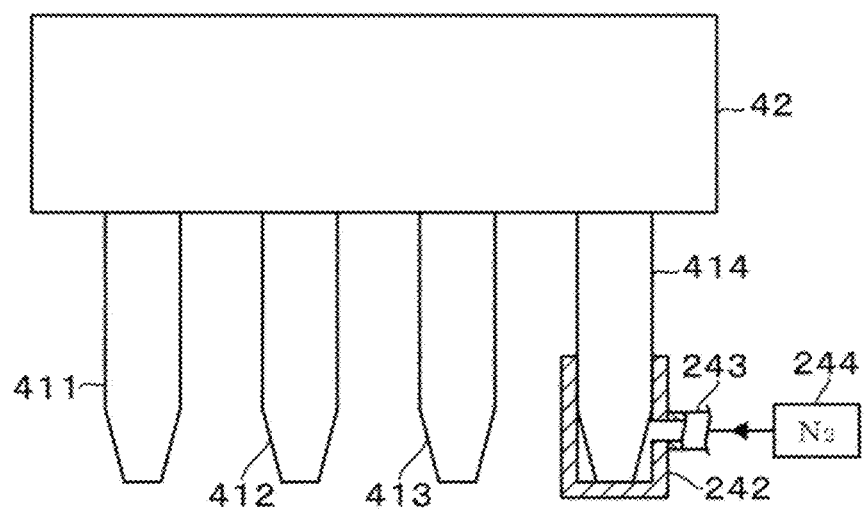
FIG. 14 is a view illustrating a second configuration example of the standby cap of the water-repellent agent nozzle.

For example, in a first reference embodiment illustrated in FIGS. 13 and 14, a standby cap 241 or 242 is provided at the arrangement position of the standby section 23 illustrated in FIG. 3 to cover the tip end portion of the water-repellent agent nozzle 414 retreated to the standby position. The standby cap 241 or 242 is connected with a purge gas supply line 243 and a purge gas supply unit 244 that supply nitrogen ($N_2$) gas, which is an inert gas, in order to suppress atmosphere containing moisture from entering into the standby cap 241 or 242.

The standby cap 241 illustrated in FIG. 13 includes a gap to allow $N_2$ gas to flow therethrough. The gap is formed between the lower end surface of the water-repellent agent nozzle 414 where the ejection port of the water-repellent agent is formed and the bottom surface of the standby cap 241, and between the outer peripheral side surface of the water-repellent agent nozzle 414 and the inner peripheral side surface of the standby cap 241. In the exemplary embodiment, $N_2$ gas is constantly supplied into the standby cap 241 during the period in which the water-repellent agent nozzle 414 is inserted into the standby cap 241 to suppress entry of atmosphere. Thus, the deterioration in the water-repellent ability of the water-repellent agent within the standby cap 241 is suppressed.

In addition, the standby cap 242 illustrated in FIG. 14 brings the lower end surface of the water-repellent agent nozzle 414, on which the ejection port of the water-repellent agent is formed, into contact with the bottom surface of the standby cap 242, to suppress entry of atmosphere. In this case, a gap may be formed between the outer circumferential side surface of the water-repellent agent nozzle 414 and the inner circumferential side surface of the standby cap 242 such that these surfaces are not rubbed against each other at the time of insertion and extraction of the water-repellent agent nozzle 414, which otherwise generates particles, and it is not necessary to form a gap through which $N_2$ gas flows. In a case where $N_2$ gas is not supplied in a state where the water-repellent agent nozzle 414 is inserted into the standby cap 242, a method of eliminating the internal atmosphere by supplying $N_2$ gas from the purge gas supply line 243 to the standby cap 242, for example, at a timing immediately before the water-repellent agent nozzle 414 is inserted, may be exemplified.

Figure 15:
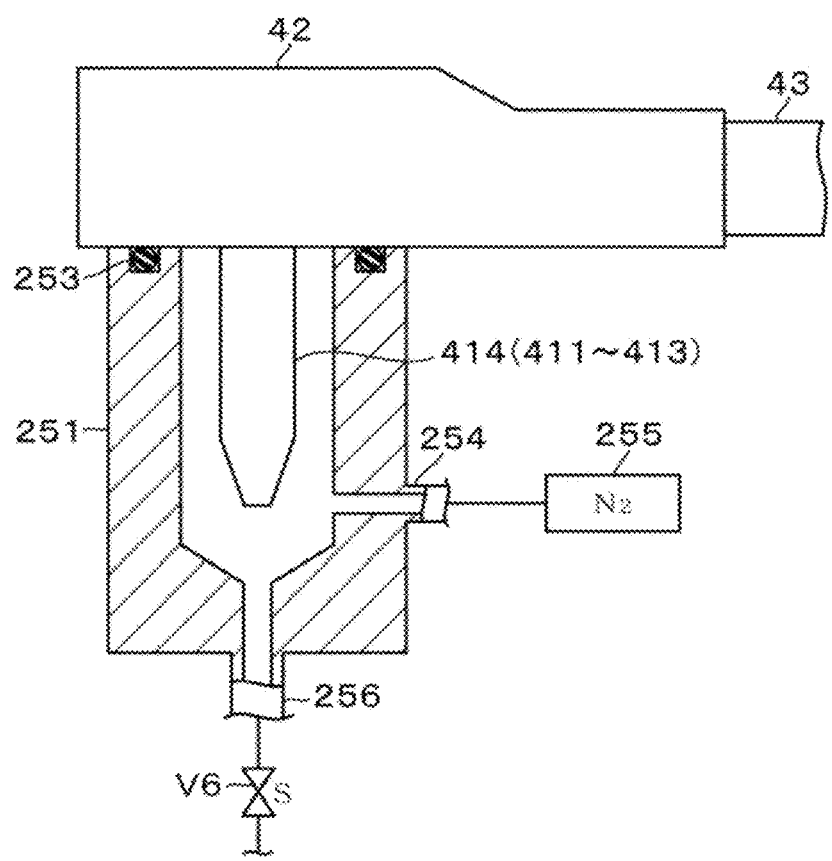
FIG. 15 is a view illustrating a first configuration example of a standby bus of a nozzle head.
Figure 16:
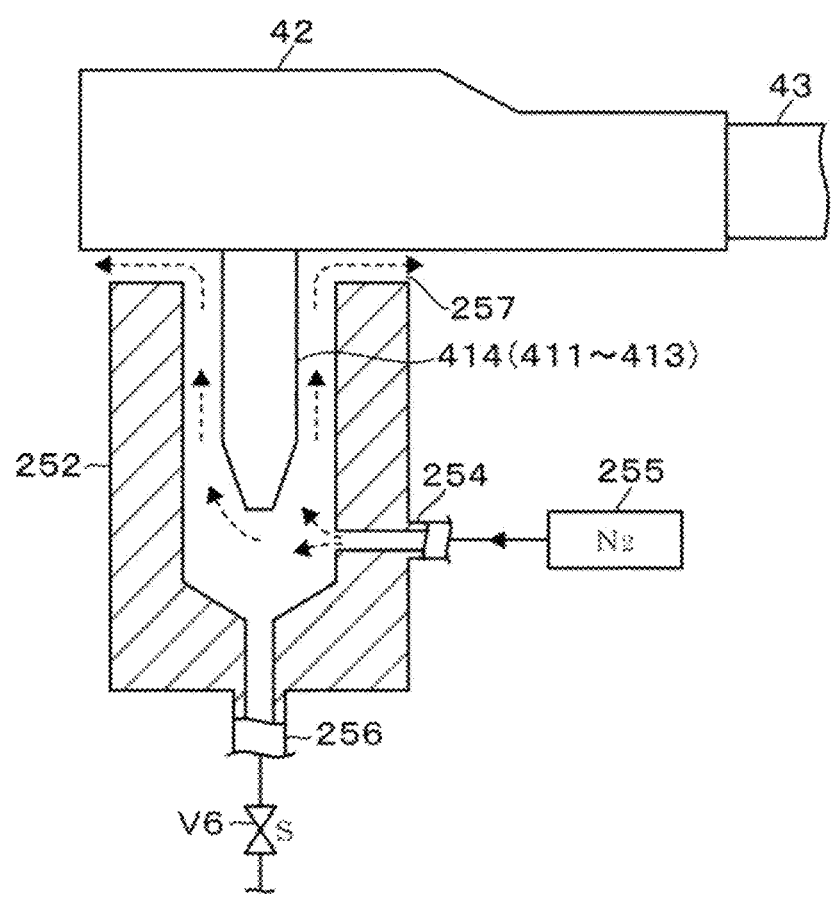
FIG. 16 is a view illustrating a second configuration example of the standby bus of the nozzle head.

In a second reference embodiment illustrated in FIGS. 15 and 16, the entire nozzles 411 to 414 provided in the nozzle head 42 including the water-repellent agent nozzle 414 are on standby in a state of being inserted into a standby bus 251 or 252 where, for example, dummy dispensing operations are performed. The standby bus 251 or 252 is also provided at the arrangement position of the standby section 23 illustrated in FIG. 3. In order to suppress atmosphere containing moisture from entering into the standby but 251 or 252, the standby bus 251 or 252 is connected with a purge gas supply line 254 and a purge gas supply unit 255 for supplying $N_2$ gas to eliminate the atmosphere.

An O-ring 253 serving as a close contact unit is provided around an opening provided at the upper surface side of the standby bus unit 251 illustrated in FIG. 15 to hermetically maintain the internal space of the standby bus 251, for example, by being in contact with the lower surface of the nozzle head 42. Then, $N_2$ gas is supplied to the standby bus 251 at a timing immediately before the nozzles 411 to 414 are inserted into the opening of the standby bus 251, so that the internal atmosphere is eliminated. Thereafter, the nozzles 411 to 414 are inserted to seal the inside of the standby bus unit 251. After the inside of the standby bus 251 is sealed, the supply of $N_2$ gas is stopped. Further, in order to prevent entry of the atmosphere from the outside, an opening/closing valve V6 of a drain line 256 is closed during a period in which, for example, a dummy dispense is not performed.

Meanwhile, in the standby bus 252 illustrated in FIG. 16, the nozzle head 42 is put on standby at a height position where a gap is formed between the upper surface of the standby bus 251 where an opening for inserting each of the nozzles 411 to 414 is formed and the lower surface of the nozzle head 42 to allow $N_2$ gas to flow therethrough. In addition, for example, $N_2$ gas is constantly supplied into the standby bus 252 during the period in which the nozzles 411 to 414 are inserted into the standby bus 252 to suppress the entry of the atmosphere.

Figure 17:
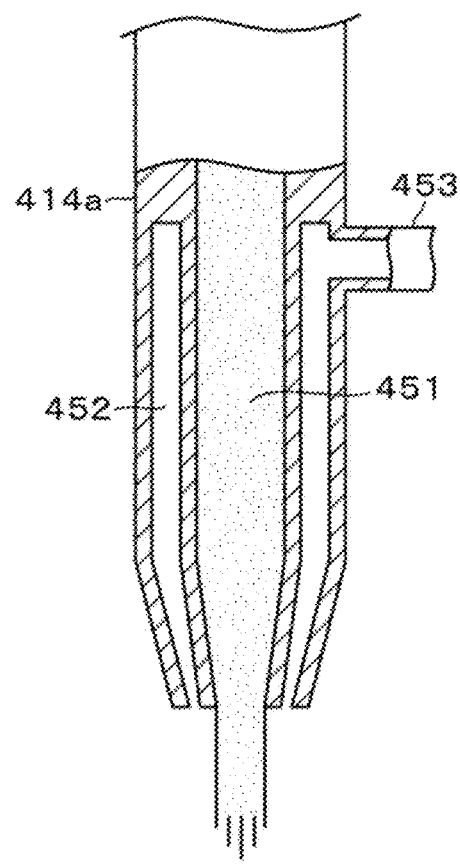
FIG. 17 is a first action diagram of a double-pipe type water-repellent agent nozzle.
Figure 18:
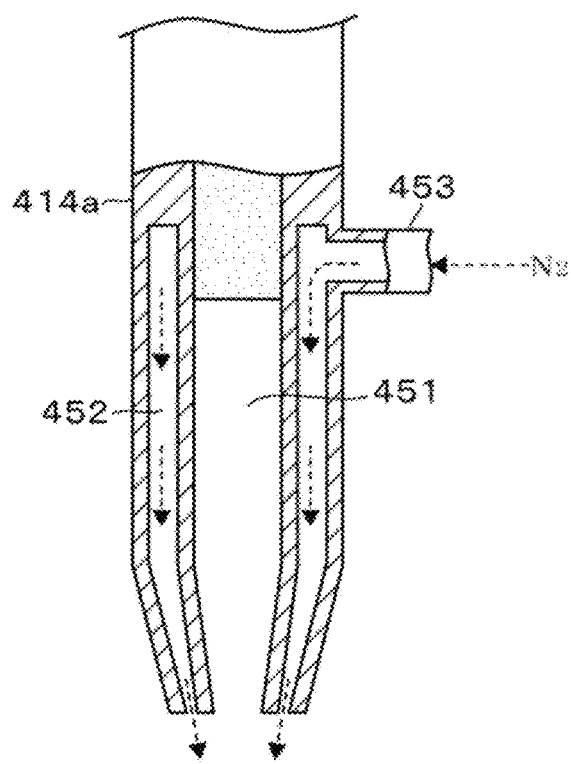
FIG. 18 is a second action diagram of the double-pipe type water-repellent agent nozzle.

In a third reference embodiment illustrated in FIGS. 17 and 18, the tip end portion of a water-repellent agent nozzle 414a has a double tube structure of a water-repellent agent supply path 451 at the central side to which the water-repellent agent is supplied, and a purge gas supply path 452 on the peripheral portion side to eliminate the atmosphere from the periphery of the ejection port of the water-repellent agent, thereby suppressing the entry into the water-repellent agent supply path 451. $N_2$ gas is supplied from a purge gas supply line 453 to the purge gas supply path 452. Further, the purge gas supply path 452 is opened obliquely downward such that the ejected $N_2$ gas joins at a position below the ejection port of the water-repellent agent.

During a period in which the water-repellent agent is ejected, the supply of the $N_2$ gas from the purge gas supply path 452 is stopped (FIG. 17). During the period in which the water-repellent agent is not ejected, the $N_2$ gas is supplied from the purge gas supply path 452 to suppress the entry of the atmosphere into the water-repellent agent supply path 451 (FIG. 18). Further, as illustrated in FIG. 18, during the supply period of the $N_2$ gas, a suck back operation is performed to draw the water-repellent agent in the vicinity of the ejection port of the water-repellent agent supply path 451 to the upstream side. Thus, the water-repellent agent may be suppressed from being dried due to the flow of the $N_2$ gas.

Figure 19:
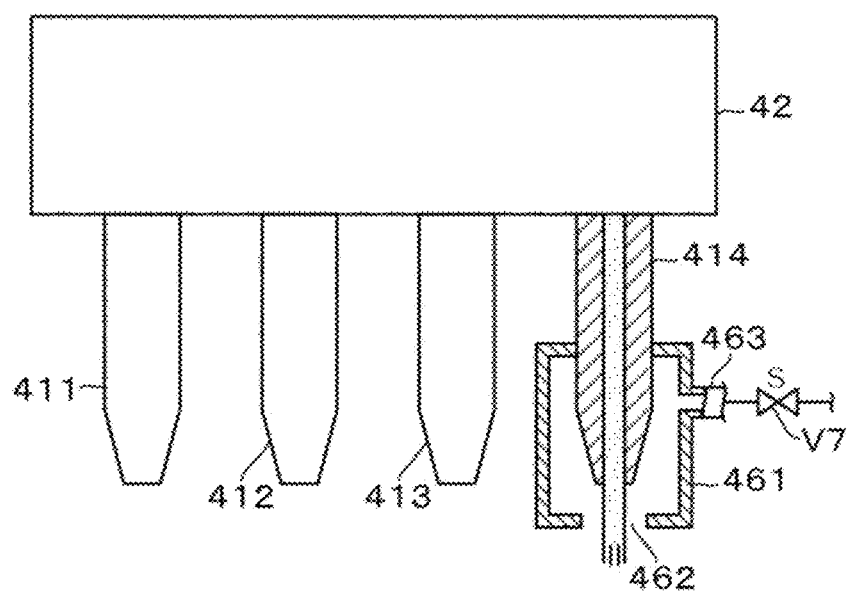
FIG. 19 is a first action diagram of a nozzle head provided with an atmosphere removal cap.
Figure 20:
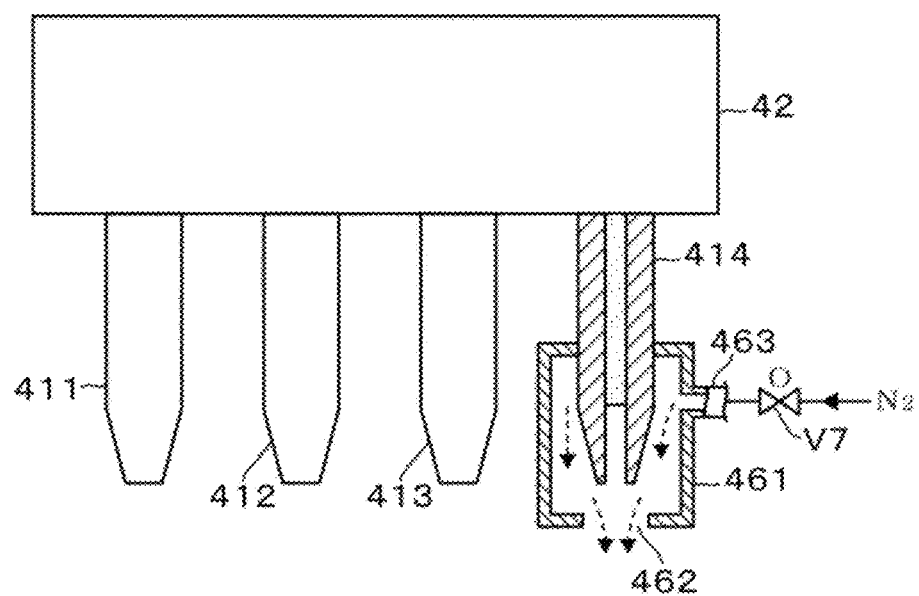
FIG. 20 is a second action diagram of the nozzle head provided with the cap.

In a fourth reference embodiment illustrated in FIGS. 19 and 20, the tip end portion of the water-repellent agent nozzle 414 is covered by a cap 461 with the bottom opened. The cap 461 is connected with a purge gas supply line 463 that supplies the $N_2$ gas into the cap 461 to eliminate the atmosphere, thereby suppressing the atmosphere from entering the inside of the water-repellent agent nozzle 414.

Then, for example, during the period in which the water-repellent agent is ejected, the opening/closing valve V7 provided in the purge gas supply line 463 is closed to stop the supply of the $N_2$ gas into the cap 461. The water-repellent agent ejected from the ejection port of the water-repellent agent nozzle 414 is supplied to the wafer W through an opening formed in the bottom surface of the cap 461 (FIG. 19).

Meanwhile, during the period in which the water-repellent agent is not ejected, the opening/closing valve V7 is opened to supply $N_2$ gas from the purge gas supply line 463 to suppress the entry of the atmosphere into the water-repellent agent nozzle 414 (FIG. 20). Further, in the exemplary embodiment, as illustrated in FIG. 20, during the supply period of the $N_2$ gas, a suck back operation is performed to draw the water-repellent agent in the vicinity of the ejection port in the water-repellent agent nozzle 414 to the upstream side. Thus, the water-repellent agent may be suppressed from being dried.

By providing the atmosphere blocking mechanisms according to various reference embodiments according to FIGS. 13 to 20, it is possible to omit the dummy dispensing operation for discharging the water-repellent agent at the outer position of the wafer W, or to reduce the ejection amount of the water-repellent agent at the time of dummy dispensing in order to ensure that the water-repellent agent at the tip end side of the water-repellent agent nozzle 414, which may possibly be deteriorated in water-repellent ability, is not supplied to the wafer W.

EXAMPLES (Test)

The temperature transition of the front surface of the wafer W was measured by changing the supply condition of the hot water to the rear surface of the wafer W in removing HFO while moving the supply position of the HFO from the central portion side of the wafer W toward the peripheral portion side.

A. Test Condition

After performing the water-repellency processing P4 on the rotating wafer W, HFO heated to 100° C. was supplied to perform the HFO replacement processing P5. Then, the HFO supply position was moved from the central portion side of the wafer W to the peripheral portion side to perform the dry processing P6.

Example

When performing the dry processing P6, the supply of hot water heated to 75° C. to the rear surface of the wafer W was started at a timing when the HFO nozzle 413 reached a position 40 mm away from the center of the wafer W. In this case, the temperature transition of the wafer W at an inner position separated by a predetermined distance from the supply position of the HFO was measured. Then, the remaining liquid film 740a substantially disappeared when the HFO nozzle 413 reached the position 40 mm away from the center of the wafer W. The inside position is a position which is spaced apart, by about several millimeters in the radially inward direction of the wafer W, from the position where the HFO ejected from the HFO nozzle 413 reaches the front surface of the wafer W, and corresponds to a position of the interface between the front surface of the dried wafer W and the HFO 740 after the residual liquid film 740a is evaporated.

Reference Example 1

The temperature transition of the wafer W was measured under the same conditions as those in Example except that no hot water was supplied to the rear surface of the wafer W.

Reference Example 2

The temperature transition of the wafer W was measured under the same conditions as those in Example except that hot water was constantly supplied to the rear surface of the wafer W while the HFO nozzle 413 was moved.

B. Test Result

FIG. 21 illustrates the temperature transition at the inside position of the supply position of the HFO in Example and Reference Examples 1 and 2. The horizontal axis in FIG. 21 represents a radial distance from the center of the wafer W. The vertical axis in FIG. 21 represents a temperature at the inside position at the time when the HFO nozzle 413 is moved. In FIG. 21, the trend line of the temperature transition of Example is indicated by a solid line, and the trend lines of Reference Examples 1 and 2 are indicated by a broken line and a one-dot chain line, respectively.

According to FIG. 21, the temperature at the inside position of the supply position of the HFO in Example was the highest (about 85° C.) at the central portion side of the wafer W, and gradually decreases as the HFO nozzle 413 was moved toward the peripheral portion side of the wafer W. In addition, when the HFO nozzle 413 reached the outer peripheral end of the wafer W, the temperature at the inner position was the lowest (about 65° C.).

On the other hand, in Reference Example 1 in which no hot water was supplied, the temperature transition in the region at the central portion side of the wafer W was substantially the same as that in Example, but the temperature at the inner position rapidly decreased after the HFO nozzle 413 reached the position 40 mm away from the center of the wafer W, and the temperature further decreased to about 40° C. when the HFO nozzle 413 reached the outer peripheral edge of the wafer W. On the contrary, in Reference Example 2 in which hot water was constantly supplied to the rear surface of the wafer W, the temperature transition was substantially the same as that in Example after the HFO nozzle 413 reached a position about 65 mm away from the center of the wafer W. Meanwhile, in the region at the central side of the wafer W, the temperature at the inside position greatly decreased due to the influence of the supply of the hot water (75° C.) that is lower in temperature than the HFO (100° C.).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing method of drying a substrate, the method comprising:
supplying deionized water to a front surface of the substrate in a state where the substrate is horizontally held;
supplying a first solvent to the front surface of the substrate;
supplying a water-repellent agent to the front surface of the substrate to impart water-repellency to the front surface of the substrate after the supplying of the first solvent to the front face of the substrate to replace the first solvent with the water-repellent agent;
removing a gas contained in a second solvent by a degasser provided at an upstream of a heater;
heating the second solvent to a temperature higher than a boiling point of the first solvent by the heater;
supplying the heated second solvent to the front surface of the substrate to which water-repellency is imparted to replace the water-repellent agent on the front surface of the substrate with the second solvent; and
removing the second solvent from the front surface of the substrate by drying the substrate after the supplying of the second solvent to the front surface of the substrate,
wherein a specific gravity of the first solvent is smaller than a specific gravity of the water-repellent agent, and a specific gravity of the second solvent is larger than the specific gravity of the water-repellent agent, and
wherein the second solvent is hydrofluoroolefin.

2. The liquid processing method of claim 1, wherein the first solvent has a mutual solubility with the deionized water and the water-repellent agent, and
the second solvent has a mutual solubility with the water-repellent agent, but is insoluble in the deionized water.

3. The liquid processing method of claim 1, wherein the first solvent is isopropyl alcohol and the water-repellent agent is trimethylsilyl dimethylamine.

4. The liquid processing method of claim 1, wherein the second solvent has a boiling point higher than a boiling point of the first solvent.

5. The liquid processing method of claim 4, wherein, after the second solvent is heated to a temperature higher than the boiling point of the first solvent, removing the gas contained in the second solvent is performed to separate the heated second solvent and bubbles contained in the second solvent.

6. The liquid processing method of claim 4, wherein the supplying the second solvent includes rotating the substrate around a vertical axis passing through a central portion of the substrate, and supplying the second solvent to the central portion, and
the removing the second solvent includes moving a supply position of the second solvent from the central portion side of the rotating substrate toward a peripheral portion side, and supplying a heated fluid to a rear surface of the rotating substrate after the supply position of the second solvent reaches a preset position on a path from the central portion side to the peripheral portion side.

7. The liquid processing method of claim 6, wherein the preset position is a position corresponding to a timing when a liquid film of the second solvent in the central portion disappears after the supply position of the second solvent is moved from the central portion.

8. The liquid processing method of claim 6, wherein the heated fluid is heated to a temperature of 50° C. or more and less than a liquid temperature of the second solvent.

9. The liquid processing method of claim 2, wherein the second solvent has a boiling point higher than a boiling point of the first solvent.

10. The liquid processing method of claim 9, wherein, after the second solvent is heated to a temperature higher than the boiling point of the first solvent, a gas-liquid separation is performed to separate the heated second solvent and bubbles contained in the second solvent.

11. The liquid processing method of claim 10, wherein, the gas contained in the second solvent is removed before the second solvent is heated to a temperature higher than the boiling point of the first solvent.

12. A substrate processing apparatus of drying a substrate, the apparatus comprising:
    a substrate holder that holds the substrate horizontally;
    a deionized water supply nozzle that supplies deionized water to a front surface of the substrate;
    a first solvent supply nozzle that supplies a first solvent to the front surface of the substrate;
    a second solvent supply nozzle that supplies a second solvent to the front surface of the substrate;
    a heater configured to heat the second solvent;
    a degasser that is provided at an upstream side of the heater and removes a gas contained in the second solvent;
    a water-repellent agent supply nozzle that supplies a water-repellent agent to impart a water-repellency to the front surface of the substrate; and
    a controller programmed to control the substrate processing apparatus to perform the method of claim 1,
    wherein the controller outputs a control signal to: supply the deionized water from the deionized water supply nozzle to the front surface of the substrate; supply the first solvent from the first solvent supply nozzle to the front surface of the substrate after the supply of the deionized water;
    supply the water-repellent agent from the water-repellent agent supply nozzle to the front surface of the substrate after the supply of the first solvent to replace the first solvent with the water-repellent agent; remove the gas contained in the second solvent using the degasser; heat the second solvent to a predetermined temperature higher than a boiling point of the first solvent using the heater; supply the heated second solvent from the second solvent supply nozzle to the front surface of the substrate to which water-repellency is imparted to replace the water-repellent agent on the front surface of the substrate with the second solvent; and remove of the second solvent from the front surface of the substrate by drying the substrate after the supply of the second solvent to the front surface of the substrate,
    wherein a specific gravity of the first solvent is smaller than a specific gravity of the water-repellent agent, and a specific gravity of the second solvent is larger than the specific gravity of the water-repellent agent, and
    wherein the second solvent is hydrofluoroolefin.

13. The substrate processing apparatus of claim 12, wherein the first solvent has a mutual solubility with the deionized water and the water-repellent agent, and
    the second solvent has a mutual solubility with the water-repellent agent but is insoluble in the deionized water.

14. The substrate processing apparatus of claim 12, wherein the first solvent is isopropyl alcohol and the water-repellent agent is trimethylsilyl dimethylamine.

15. The substrate processing apparatus of claim 12, wherein the second solvent has a boiling point higher than the boiling point of the first solvent.

16. The substrate processing apparatus of claim 15, further comprising:
    a gas-liquid separator that is provided at a downstream side of the heater and performs a gas-liquid separation of the heated second solvent and bubbles contained in the second solvent.

17. A non-transitory computer-readable storage medium that stores a computer program for use in a substrate processing apparatus of drying a substrate held horizontally after supplying deionized water to the substrate,
    wherein the computer program includes a step group organized to, when executed, causes a computer to execute the liquid processing method of claim 1.

* * * * *